United States Patent
Masuda

(10) Patent No.: US 8,951,823 B2
(45) Date of Patent: Feb. 10, 2015

(54) METHOD FOR MANUFACTURING SOLID-STATE IMAGING ELEMENT, SOLID-STATE IMAGING ELEMENT, METHOD FOR MANUFACTURING ELECTRONIC APPARATUS, AND ELECTRONIC APPARATUS

(75) Inventor: Yoshiaki Masuda, Kumamoto (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/480,959

(22) Filed: May 25, 2012

(65) Prior Publication Data

US 2013/0001724 A1 Jan. 3, 2013

(30) Foreign Application Priority Data

Jun. 28, 2011 (JP) ................................. 2011-142428

(51) Int. Cl.
*H01L 21/00* (2006.01)
*H01L 27/146* (2006.01)

(52) U.S. Cl.
CPC .... *H01L 27/14627* (2013.01); *H01L 27/14623* (2013.01); *H01L 27/14629* (2013.01); *H01L 27/14685* (2013.01)
USPC ................. 438/65; 438/69; 257/294; 257/98; 257/E33.068; 257/432

(58) Field of Classification Search
CPC ....................... H01L 31/0524; H01L 27/14627
USPC ......... 257/294, 98, E33.068, 432; 438/65, 69
See application file for complete search history.

(56) References Cited

U.S. PATENT DOCUMENTS

| | | | | |
|---|---|---|---|---|
| 7,265,402 | B2 * | 9/2007 | Koyanagi | 257/292 |
| 2003/0219992 | A1 * | 11/2003 | Schaper | 438/748 |
| 2005/0007669 | A1 * | 1/2005 | Sakai | 359/619 |
| 2005/0045805 | A1 * | 3/2005 | Sakoh et al. | 250/208.1 |
| 2009/0122178 | A1 * | 5/2009 | Kwon et al. | 348/340 |
| 2010/0193669 | A1 * | 8/2010 | Yamaguchi et al. | 250/214.1 |
| 2010/0289939 | A1 * | 11/2010 | Ogino et al. | 348/340 |

FOREIGN PATENT DOCUMENTS

JP 10-163462 6/1998

* cited by examiner

*Primary Examiner* — Kyoung Lee
*Assistant Examiner* — Ratisha Mehta
(74) *Attorney, Agent, or Firm* — Oblon, Spivak, McClelland, Maier & Neustadt, L.L.P.

(57) ABSTRACT

Disclosed herein is a method for manufacturing a solid-state imaging element, the method including forming lenses that are each provided corresponding to a light receiving part of a respective one of a plurality of pixels arranged in an imaging area over a semiconductor substrate and collect light onto the light receiving parts; forming a light blocking layer by performing film deposition on the lenses by using a material having light blocking capability; and forming a light blocker composed of the material having light blocking capability at a boundary part between the lenses adjacent to each other by etching the light blocking layer in such a manner that the material having light blocking capability is left at the boundary part between the lenses.

11 Claims, 14 Drawing Sheets

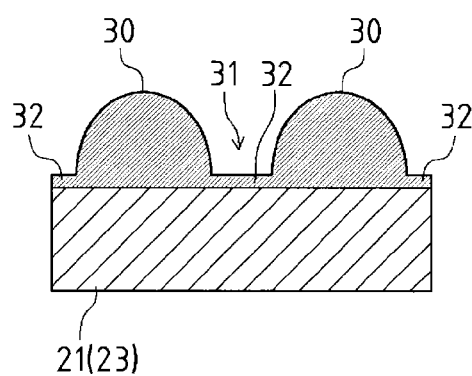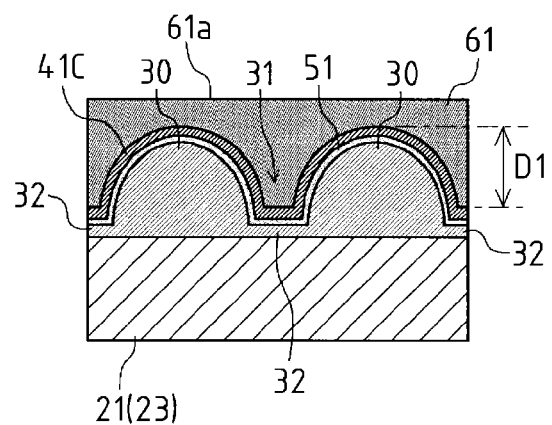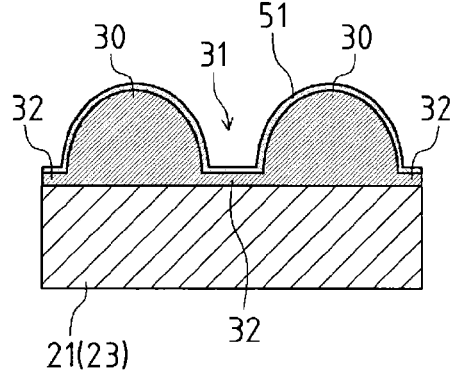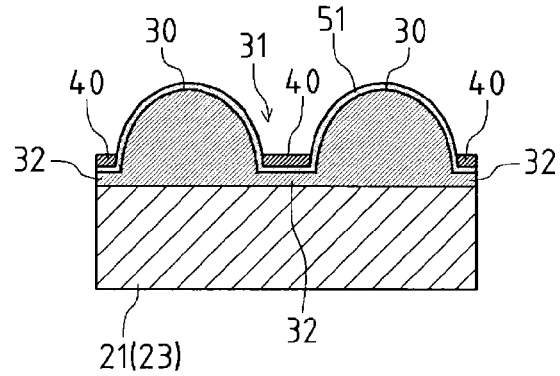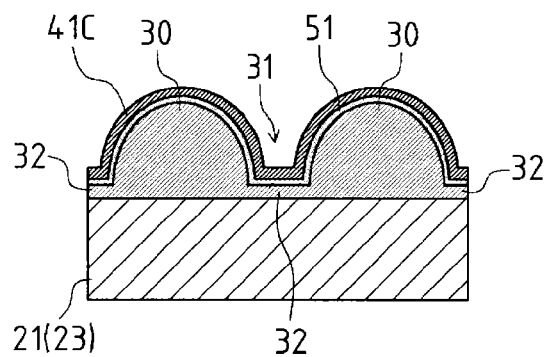

METHOD FOR MANUFACTURING SOLID-STATE IMAGING ELEMENT, SOLID-STATE IMAGING ELEMENT, METHOD FOR MANUFACTURING ELECTRONIC APPARATUS, AND ELECTRONIC APPARATUS

BACKGROUND

The present technique relates to a method for manufacturing a solid-state imaging element, a solid-state imaging element, a method for manufacturing electronic apparatus including it, and electronic apparatus.

The solid-state imaging element typified by element of the charge coupled device (CCD) type and element of the complementary metal oxide semiconductor (CMOS) type includes plural pixels disposed in a matrix manner for example and includes color filters and lenses provided corresponding to the respective pixels.

Each pixel configuring the solid-state imaging element has a light receiving part such as a photodiode having a photoelectric conversion function. The color filters provided corresponding to the respective pixels are each a filter part of any color among e.g. red, green, and blue and each transmit light of a component of a respective one of the colors. The lenses provided corresponding to the respective pixels are each provided corresponding to the light receiving part of a respective one of the pixels and each collect incident light from the external onto the corresponding light receiving part. Examples of the lens included in the solid-state imaging element include an on-chip lens provided on the upper side of the color filter (light incident side) and an in-layer lens that is provided inside the layer-laminated structure configuring the respective pixels and collects light transmitted through the color filter.

In such a solid-state imaging element, a phenomenon of so-called color crosstalk often occurs. The color crosstalk refers to a phenomenon in which, at the boundary part between adjacent pixels of colors different from each other, part of light incident on the color filter corresponding to the pixel of one of the colors is incident on the photodiode of the pixel of the other of the colors as oblique light or the like. The color crosstalk often causes unevenness of the sensitivity and image quality in the solid-state imaging element. Problems due to such color crosstalk become more pronounced along with microminiaturization, increase in the number of pixels, and so forth in the solid-state imaging element.

In order to suppress the color crosstalk in the solid-state imaging element, in a related art, a light blocker as a layer or a film having a light blocking function is provided between pixels adjacent to each other. For example, Japanese Patent Laid-open No. 10-163462 (hereinafter, Patent Document 1) discloses a configuration including a metal thin film as a light blocker formed into a grid form in a lattice manner for each unit cell compartment in a solid-state imaging element.

In the configuration disclosed in Patent Document 1, each inside part of the grid-form metal thin film serves as a segmentalized light receiving part region and a color filter and a microlens are independently provided for each light receiving part region. The grid-form metal thin film exists at the boundary part between adjacent pixels, of the color filters and the microlenses provided corresponding to the respective pixels.

SUMMARY

Certainly, it will be considered that, according to the configuration including the grid-form metal thin film surrounding each light receiving part region in a solid-state imaging element like the configuration of Patent Document 1, each light receiving part region is surrounded in a cylindrical manner by the metal thin film and the light collection efficiency is enhanced to allow achievement of enhancement in the sensitivity and suppression of color crosstalk.

However, in the related-art solid-state imaging element like that disclosed in Patent Document 1, the light blocker provided between adjacent pixels is formed by patterning. Therefore, pattern misalignment between the lens provided corresponding to the light receiving part of the pixel and the light blocker located between adjacent pixels easily occurs and the accuracy of pattern alignment between the lens and the light blocker is low. Unless the accuracy of pattern alignment between the lens and the light blocker is sufficiently ensured, it is difficult to respond to microminiaturization and increase in the number of pixels in the solid-state imaging element.

There is a need for the present technique to provide a method for manufacturing a solid-state imaging element, a solid-state imaging element, a method for manufacturing electronic apparatus, and electronic apparatus that each have the following advantages. Specifically, in providing a light blocker at the boundary part between lenses provided corresponding to the light receiving parts of the respective pixels, the light blocker can be formed in a self-aligned manner. Thus, the accuracy of pattern alignment between the lens and the light blocker can be enhanced and it is possible to easily respond to microminiaturization and increase in the number of pixels.

According to an embodiment of the present technique, there is provided a method for manufacturing a solid-state imaging element. The method includes forming lenses that are each provided corresponding to a light receiving part of a respective one of a plurality of pixels arranged in an imaging area over a semiconductor substrate and collect light onto the light receiving parts, and forming a light blocking layer by performing film deposition on the lenses by using a material having light blocking capability. The method further includes forming a light blocker composed of the material having light blocking capability at a boundary part between the lenses adjacent to each other by etching the light blocking layer in such a manner that the material having light blocking capability is left at the boundary part between the lenses.

According to another embodiment of the present technique, there is provided a solid-state imaging element including a plurality of pixels configured to be arranged in an imaging area over a semiconductor substrate and each have a light receiving part that accumulates a signal charge obtained by photoelectric conversion of incident light, and color filters configured to be each provided for a respective one of the plurality of pixels. The solid-state imaging element further includes lenses configured to be each provided corresponding to the light receiving part of the respective one of the plurality of pixels and collect light onto the light receiving parts, and a light blocker configured to be provided at a boundary part between the lenses adjacent to each other and be composed of a metal.

According to another embodiment of the present technique, there is provided a method for manufacturing electronic apparatus having a solid-state imaging element, an optical system that guides incident light to light receiving parts of the solid-state imaging element, a drive circuit that generates a drive signal for driving the solid-state imaging element, and a signal processing circuit that processes an output signal of the solid-state imaging element. The method includes, as manufacturing the solid-state imaging element, forming lenses that are each provided corresponding to the light receiving part of a respective one of a plurality of pixels arranged in an imaging area over a semiconductor substrate and collect light onto the light receiving parts, and forming a light blocking layer by performing film deposition on the lenses by using a material having light blocking capability. The method further includes forming a light blocker composed of the material having light blocking capability at a boundary part between the lenses adjacent to each other by etching the light blocking layer in such a manner that the material having light blocking capability is left at the boundary part between the lenses.

According to another embodiment of the present technique, there is provided electronic apparatus having a solid-state imaging element, an optical system that guides incident light to light receiving parts of the solid-state imaging element, a drive circuit that generates a drive signal for driving the solid-state imaging element, and a signal processing circuit that processes an output signal of the solid-state imaging element. The solid-state imaging element includes a plurality of pixels configured to be arranged in an imaging area over a semiconductor substrate and each have the light receiving part that accumulates a signal charge obtained by photoelectric conversion of incident light, and color filters configured to be each provided for a respective one of the plurality of pixels. The solid-state imaging element further includes lenses configured to be each provided corresponding to the light receiving part of the respective one of the plurality of pixels and collect light onto the light receiving parts, and a light blocker configured to be provided at a boundary part between the lenses adjacent to each other and be composed of a metal.

According to the embodiments of the present technique, the light blocker can be formed in a self-aligned manner in providing the light blocker at the boundary part between the lenses provided corresponding to the light receiving parts of the respective pixels. Thus, the accuracy of pattern alignment between the lens and the light blocker can be enhanced and it is possible to easily respond to microminiaturization and increase in the number of pixels.

BRIEF DESCRIPTION OF THE DRAWINGS

FIGS. 12A to 12E are explanatory diagrams about a method for manufacturing the solid-state imaging element according to a third embodiment of the present technique;

DETAILED DESCRIPTION OF THE PREFERRED EMBODIMENT

[Outline of Present Technique]

Because of recent requirements for the solid-state imaging element to have smaller size and a larger number of pixels, the incident angle of light to the end of angle of view of the solid-state imaging element becomes increasingly larger. Light having a large incident angle causes color crosstalk between pixels as obliquely incident light. So, for suppression of the color crosstalk worsened due to obliquely incident light, it is effective to provide a light blocker at the boundary part between pixels, of lenses provided corresponding to light receiving parts of the respective pixels, specifically e.g. at the bottom of the gap part between the lenses. However, if the accuracy of pattern alignment between the lens and the light blocker is low, it is difficult to respond to microminiaturization and increase in the number of pixels in the solid-state imaging element and the lowering of the sensitivity occurs in some cases.

An embodiment of the present technique provides a light blocker at the boundary part between lenses provided corresponding to light receiving parts of the respective pixels to thereby reduce color crosstalk and allows the light blocker between the lenses to be formed in a self-aligned manner. This enhances the accuracy of pattern alignment between the lens and the light blocker and makes it easy to respond to microminiaturization and increase in the number of pixels in the solid-state imaging element.

Furthermore, an embodiment of the present technique uses a metal as the material of the light blocker provided between the lenses adjacent to each other to thereby realize a solid-state imaging element that can withstand a high temperature process and has a wide application range with achievement of high light blocking capability regarding the light blocker.

Embodiments of the present technique will be described below. The embodiments to be described below will be explained by taking a solid-state imaging element (image sensor) of a CCD type as an example of a solid-state imaging element. However, embodiments of the present technique can be widely applied also to other solid-state imaging elements such as a solid-state imaging element of a CMOS type, besides the CCD-type element.

[Configuration of Solid-State Imaging Element]

The configuration of a solid-state imaging element according to a first embodiment of the present technique will be described with use of FIG. 1 and FIG. 2. FIG. 2 is equivalent to a partial sectional view at position A-A' in FIG. 1.

Figure 1:
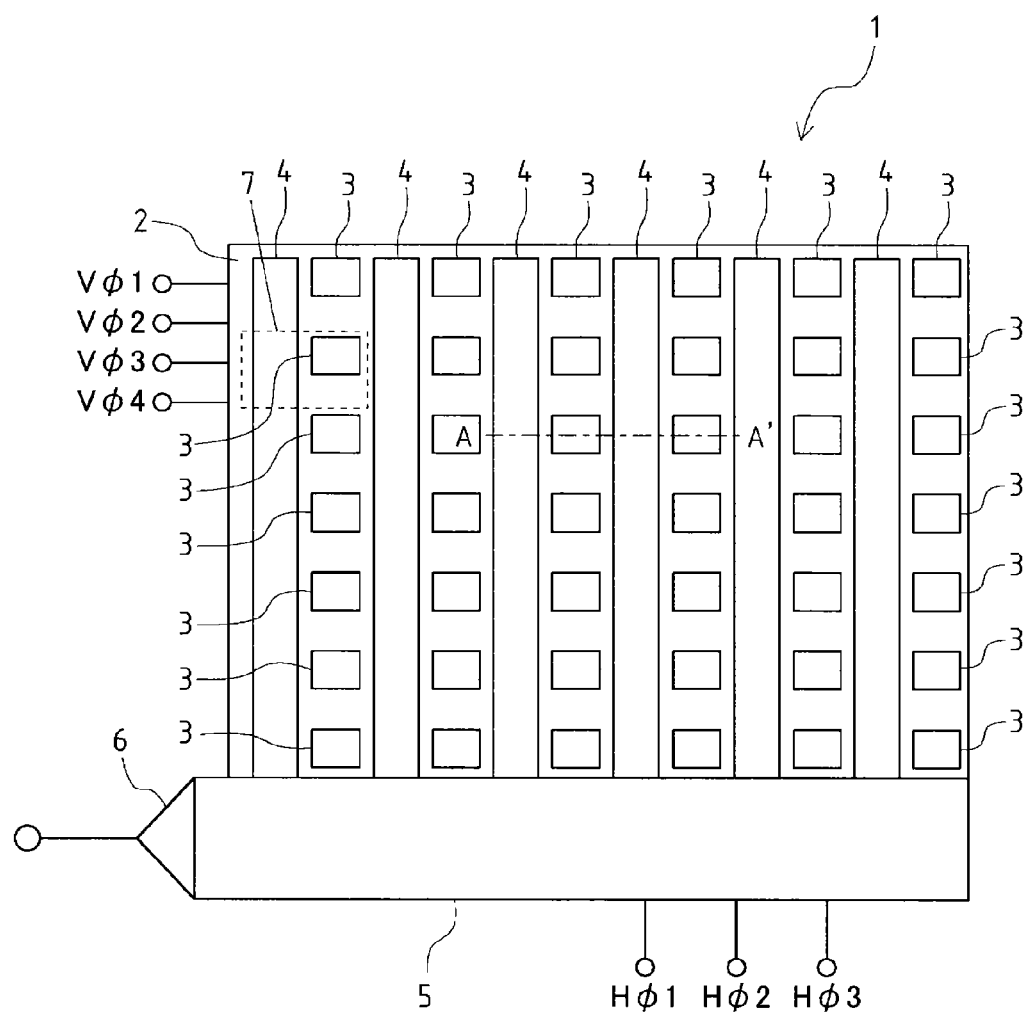
FIG. 1 is a diagram showing the configuration of a solid-state imaging element according to one embodiment of the present technique.
Figure 2:
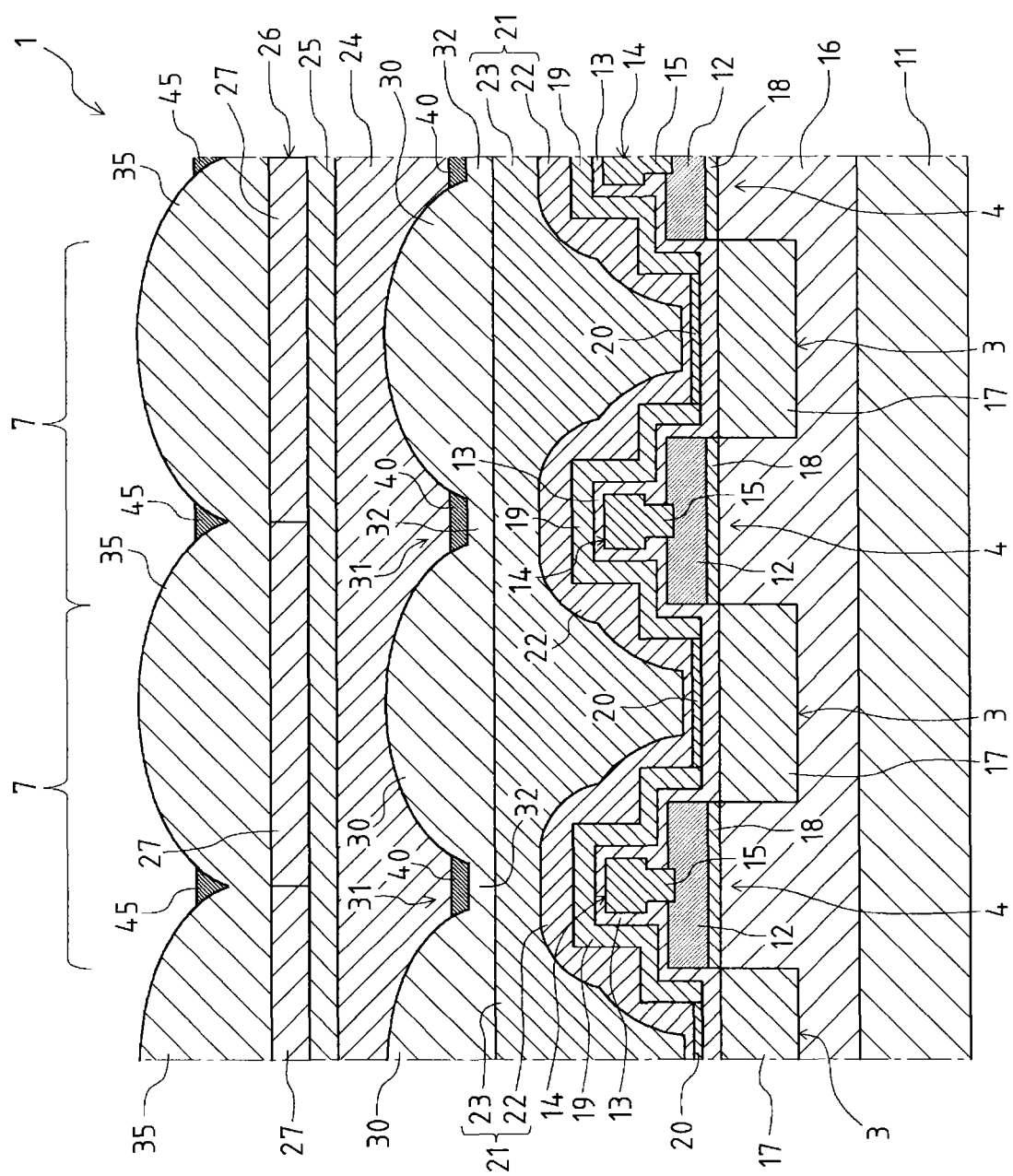
FIG. 2 is a sectional view showing the configuration of the solid-state imaging element according to one embodiment of the present technique.

As shown in FIG. 1 and FIG. 2, a solid-state imaging element 1 has a rectangular imaging area 2 configured over a semiconductor substrate 11. The solid-state imaging element 1 includes plural light receiving parts 3 in the imaging area 2. The plural light receiving parts 3 are arranged in a matrix manner in the imaging area 2 over the semiconductor substrate 11. Specifically, the plural light receiving parts 3 are disposed in a two-dimensional matrix manner in the longitudinal direction and the lateral direction along the rectangular imaging area 2. For the solid-state imaging element 1 of the present embodiment, the longitudinal direction is defined as the vertical direction and the lateral direction is defined as the horizontal direction in FIG. 1.

The light receiving part 3 is configured by a photodiode 17, which is a photoelectric conversion element, and configures a pixel 7 in the imaging area 2. That is, the plural pixels 7 included in the solid-state imaging element 1 are arranged in the imaging area 2 over the semiconductor substrate 11 and each have the light receiving part 3. The light receiving part 3 accumulates a signal charge obtained by photoelectric conversion of incident light. Specifically, the light receiving part 3 has a light receiving surface and generates a signal charge depending on the amount (intensity) of light incident on the light receiving surface by photoelectric conversion to accumulate the generated signal charge.

The solid-state imaging element 1 includes plural vertical transfer registers 4 that transfer the signal charge in the vertical direction and a horizontal transfer register 5 that transfers, in the horizontal direction, the signal charge transferred by the vertical transfer registers 4 as charge transfer sections (transfer registers) that transfer the signal charge generated by the light receiving parts 3.

The vertical transfer registers 4 are provided along the respective lines of the column direction (vertical direction) in the two-dimensional matrix arrangement of the plural light receiving parts 3. Specifically, as shown in FIG. 1, the plural vertical transfer registers 4 are provided in such a state as to be each adjacent to one side (left side, in FIG. 1) of a respective one of the columns and be disposed in parallel to each other along the lines of the light receiving parts 3 in the vertical direction, for each of the columns of the plural light receiving parts 3 disposed in a matrix manner in the vertical direction. The signal charge generated by the light receiving part 3 is read out to the vertical transfer register 4 and transferred in the vertical direction by the vertical transfer register 4.

The horizontal transfer register 5 is disposed along the side of the rectangular imaging area 2 along the horizontal direction on one side in the vertical direction (lower side, in FIG. 1). Therefore, the vertical transfer register 4 transfers the signal charge read out from the light receiving part 3 in the vertical direction toward the horizontal transfer register 5 (toward the lower side, in FIG. 1).

The signal charge transferred by the vertical transfer register 4 and the horizontal transfer register 5 is output from an output section 6 provided on the termination side of the horizontal transfer register 5. The output section 6 converts the transferred signal charge to an electrical signal by an output amplifier such as a floating diffusion (FD) amplifier and outputs it.

The vertical transfer register 4 and the horizontal transfer register 5 each have plural kinds of electrodes and a buried transfer region provided on the lower side of the electrodes (on the side of the semiconductor substrate 11). In FIG. 2, transfer electrodes 12 as the electrodes configuring the vertical transfer registers 4 are shown.

The vertical transfer register 4 and the horizontal transfer register 5 are each driven by plural-phase drive pulses. The vertical transfer register 4 is driven by e.g. four-phase drive pulses. In this case, the vertical transfer register 4 has four kinds of transfer electrodes associated with the four-phase driving as the transfer electrodes 12. These four kinds of transfer electrodes include a read electrode for reading out the signal charge from the light receiving part 3. In the vertical transfer register 4, these four kinds of transfer electrodes are repeatedly provided in predetermined order in the vertical direction in units of two pixels 7 adjacent to each other in the vertical direction (in units of two pixels).

These four kinds of transfer electrodes included in the vertical transfer register 4 are each independently given a respective one of four-phase clock pulses V$\phi$1, V$\phi$2, V$\phi$3, and V$\phi$4 as a drive voltage. By proper control of the amplitude and timing of these four-phase clock pulses V$\phi$1, V$\phi$2, V$\phi$3, and V$\phi$4, the signal charge read out from the respective light receiving parts 3 to the vertical transfer register 4 is transferred in accordance with the sequence of the electrodes of the vertical transfer register 4.

The horizontal transfer register 5 is driven by e.g. three-phase drive pulses. In this case, the horizontal transfer register 5 has three kinds of transfer electrodes associated with the three-phase driving as the electrodes. These three kinds of transfer electrodes included in the horizontal transfer register 5 are each independently given a respective one of three-phase clock pulses H$\phi$1, H$\phi$2, and H$\phi$3 as a drive voltage. By proper control of the amplitude and timing of these three-phase clock pulses H$\phi$1, H$\phi$2, and H$\phi$3, the signal charge transferred from the vertical transfer register 4 to the horizontal transfer register 5 is transferred in the horizontal direction.

The sectional structure of the solid-state imaging element 1 will be described. As shown in FIG. 2, over the transfer electrode 12 of the vertical transfer register 4, a connection line 14 is provided with the intermediary of an insulating film 13 that is e.g. a silicon oxide film ($SiO_2$ film). The connection line 14 is electrically connected to the transfer electrode 12 via a contact 15 composed of e.g. tungsten. The connection line 14 is disposed in association with the arrangement of various kinds of transfer electrodes 12 on a predetermined route along the horizontal direction and the vertical direction, and functions to apply predetermined drive voltages to the respective transfer electrodes 12.

As shown in FIG. 2, a semiconductor layer 16 is provided on the semiconductor substrate 11 and the photodiode 17 configuring the light receiving part 3 is provided in this semiconductor layer 16. If the semiconductor substrate 11 is a silicon semiconductor substrate of the n-type as a first conductivity type for example, the semiconductor layer 16 is formed as a semiconductor well region of the p-type as a second conductivity type.

On the semiconductor layer 16, a gate oxide film 18 is provided under the transfer electrode 12 of the vertical transfer register 4. That is, over the semiconductor layer 16, the transfer electrode 12 is provided with the intermediary of the gate oxide film 18 and the connection line 14 is provided over the transfer electrode 12 with the intermediary of the insulating film 13. The insulating film 13 is so provided as to cover the transfer electrodes 12 and part including the areas where the connection line 14 provided over the transfer electrode 12 is disposed and the areas where the light receiving parts 3 are disposed.

On the insulating film 13, light blocking films 19 are so provided as to cover the transfer electrodes 12 of the vertical transfer registers 4 and the connection line 4 in the areas outside the areas where the light receiving parts 3 are provided. Over the light receiving part 3, part of the insulating film 13 exists and an insulating film 20 that is e.g. a silicon nitride film (SiN film) is provided. A multilayer insulating film composed of the insulating films 13 and 20 over this light receiving part 3 functions as an antireflection layer at the interface of the semiconductor substrate 11 and prevents the lowering of the sensitivity.

In the imaging area 2, a waveguide 21 for collecting incident light onto the light receiving parts 3 is provided on the upper side of the semiconductor layer 16, in which the light receiving parts 3 are provided. The waveguide 21 is composed of a clad layer 22 and a core layer 23.

The clad layer 22 is so formed as to follow the shape of the layer-laminated structure composed of the transfer electrode 12 of the vertical transfer register 4 provided along the arrangement of the light receiving parts 3, the connection line 14, and the light blocking film 19 and cover this layer-laminated structure. Therefore, in the clad layer 22, concave parts are formed between the vertical transfer registers 4 adjacent to each other.

The core layer 23 is so provided as to fill the concave parts formed in the clad layer 22. The core layer 23 is composed of a material having a refractive index higher than that of the material of the clad layer 22. For example, if the clad layer 22 is formed by a silicon oxide film, the core layer 23 is formed by e.g. a silicon nitride film or a silicon oxynitride film, which is a material having a refractive index higher than that of the silicon oxide film.

In-layer lenses 30 are provided on the waveguide 21. In the present embodiment, the in-layer lens 30 is provided corresponding to the light receiving part 3 (photodiode 17) configuring the pixel 7 for each pixel 7. Therefore, the plural in-layer lenses 30 are disposed in a matrix manner in the plane similarly to the pixels 7. In the present embodiment, the in-layer lenses 30 are composed of e.g. an inorganic material such as SiN (silicon nitride). In this manner, the solid-state imaging element 1 includes the in-layer lenses 30 that are each provided corresponding to the light receiving part 3 of a respective one of the plural pixels 7 and collect light onto the light receiving parts 3.

As shown in FIG. 2, the in-layer lens 30 has a convex shape toward the light incident side (upper side in FIG. 2). Specifically, in the present embodiment, the in-layer lens 30 has a sectional shape that is a substantially elliptical shape or a substantially circular shape. Thus, the boundary part between the in-layer lenses 30 adjacent to each other forms a concave part. In the present embodiment, at the boundary part between the in-layer lenses 30 adjacent to each other, a gap part 31 exists and a flat part 32 linking the bottoms of the in-layer lenses 30 to each other is provided. The flat part 32 is a film-like part disposed along the top surface of the core layer 23 of the waveguide 21 between the in-layer lenses 30 adjacent to each other, and is part formed collectively with the in-layer lenses 30.

A passivation film 24 is provided on the in-layer lenses 30. The passivation film 24 is so formed as to cover the whole surface of the in-layer lenses 30, including the flat parts 32. The passivation film 24 is formed by e.g. a silicon oxide film (SiO$_2$). A color filter layer 26 is provided over the passivation film 24 with the intermediary of a planarization film 25. The planarization film 25 is formed by e.g. an organic applied film of an acrylic resin or the like. The passivation film 24 may be omitted and the planarization film 25 may be provided on the in-layer lenses 30. In this case, the planarization film 25 is so formed as to cover the whole surface of the in-layer lenses 30, including the flat parts 32.

The color filter layer 26 is divided into color filters 27 provided corresponding to the respective pixels 7. That is, the color filter layer 26 is divided into the plural color filters 27 for each light receiving part 3 (photodiode 17) configuring a respective one of the pixels 7. In the solid-state imaging element 1 of the present embodiment, each color filter 27 is a filter part of any color among red (R), green (G), and blue (B) and transmits light of a component of a respective one of the colors. The color filters 27 of the respective colors are so-called on-chip color filters and are formed in accordance with the arrangement of the plural pixels 7. In this manner, the solid-state imaging element 1 includes the color filters 27 each provided for a respective one of the plural pixels 7.

Plural microlenses 35 are provided on the color filter layer 26. The microlens 35 is a so-called on-chip microlens and is formed for each pixel 7 corresponding to the light receiving part 3 (photodiode 17) configuring the pixel 7. Therefore, the plural microlenses 35 are disposed in a matrix manner in the plane similarly to the pixels 7. In the present embodiment, the microlenses 35 are composed of e.g. an inorganic material such as SiN (silicon nitride). In this manner, the solid-state imaging element 1 includes the microlenses 35 that are each provided corresponding to the light receiving part 3 of a respective one of the plural pixels 7 and collect light onto the light receiving parts 3.

As shown in FIG. 2, the microlens 35 has a convex shape toward the light incident side (upper side in FIG. 2). Thus, the boundary part between the microlenses 35 adjacent to each other forms a concave part.

The microlens 35 collects incident light from the external onto the light receiving part 3 (photodiode 17) of the corresponding pixel 7. The light focused by the microlens 35 is further collected by the in-layer lens 30 provided on the waveguide 21 as described above to be guided to the light receiving part 3.

In this manner, the solid-state imaging element 1 of the present embodiment has the microlenses 35, which are on-chip lenses provided on the color filter 27, and the in-layer lenses 30 provided inside the layer-laminated structure configuring the respective pixels 7 as lenses that are each provided corresponding to the light receiving part 3 of a respective one of the plural pixels 7 and collect light onto the light receiving parts 3. Due to this feature, high efficiency of light collection onto the light receiving part 3 is obtained and favorable sensitivity is achieved.

In the solid-state imaging element 1 of the present embodiment having the above-described configuration, light blockers 40 are each provided at the boundary part between the in-layer lenses 30 adjacent to each other. The light blocker 40 is provided as a layer-like or film-like part stacked on the flat part 32 between the lenses of the in-layer lenses 30 adjacent to each other. That is, the light blocker 40 is provided at the bottom of the gap part 31 between the lenses of the in-layer lenses 30.

The light blocker 40 is formed by using a metal as its material. As the metal to form the light blocker 40, e.g. any one kind of W (tungsten), Al (aluminum), Ag (silver), Au (gold), Ru (ruthenium), Ti (titanium), etc. or an alloy containing at least two kinds of metals among these metals is used.

By providing the light blocker 40 at the boundary part between the in-layer lenses 30 adjacent to each other in this manner, color crosstalk at the boundary part between the adjacent pixels 7 of colors different from each other can be reduced. The "color" about the pixel 7 means the color of the color filter 27 corresponding to this pixel 7. The effect of reduction in color crosstalk by the light blocker 40 will be described with use of FIG. 3.

Figure 3:
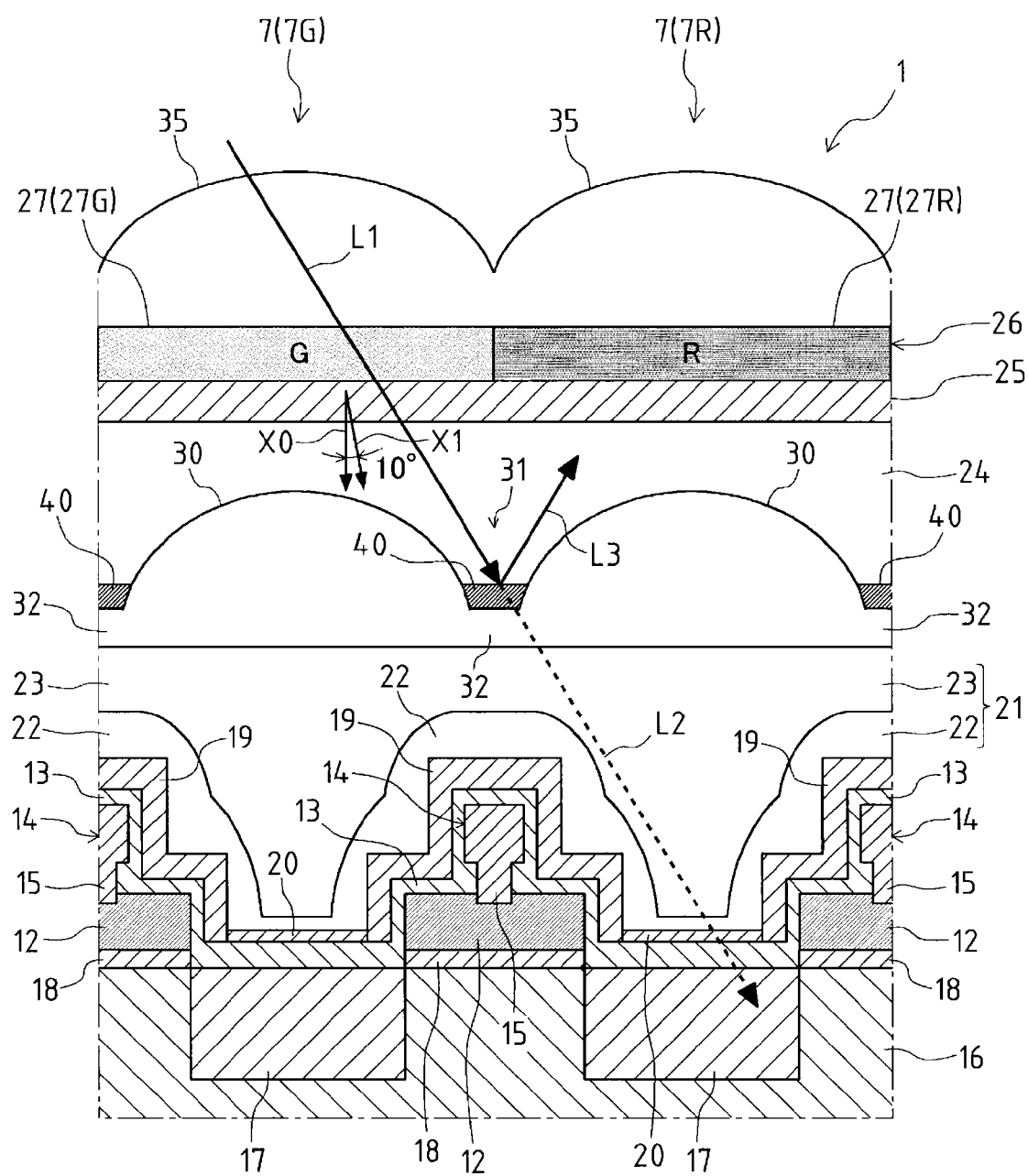
FIG. 3 is an explanatory diagram about effects of the solid-state imaging element according to one embodiment of the present technique.

In FIG. 3, as one example of the combination of the pixels 7 of colors different from each other, a combination in which a green (G) pixel 7 having a green color filter 27G (hereinafter, referred to as the "G pixel 7G") and a red (R) pixel 7 having a red color filter 27 (27R) (hereinafter, referred to as the "R pixel 7R") are adjacent to each other is shown. Furthermore, in the sectional view shown in FIG. 3, hatching for part of the constituent elements is omitted for convenience.

As shown in FIG. 3, the most part of light incident on the microlens 35 of the G pixel 7G is transmitted through the green color filter 27G and enters the photodiode 17 of the G pixel 7G. Meanwhile, the light incident on the microlens 35 of the G pixel 7G includes oblique light that cannot be collected by the microlens 35 and travels toward the R pixel 7R adjacent to the G pixel 7G after being transmitted through the green color filter 27G to enter the photodiode 17 of this R pixel 7R (see solid arrow L1 and dashed arrow L2).

Furthermore, the most part of light incident on the microlens 35 of the R pixel 7R is transmitted through the red color filter 27R and enters the photodiode 17 of the R pixel 7R. Therefore, if the light transmitted through the green color filter 27G enters the photodiode 17 of the R pixel 7R as oblique light as described above, color crosstalk of green (G) and red (R) occurs. That is, optical color crosstalk occurs because the color of the color filter 27 through which light incident on the photodiode 17 is transmitted is different from the color of the color filter 27 provided corresponding to the photodiode 17 that receives this light.

So, the optical color crosstalk is suppressed due to the provision of the light blocker 40 at the boundary part between the in-layer lenses 30 adjacent to each other like in the solid-state imaging element 1 of the present embodiment. Specifically, as shown in FIG. 3, for example, the oblique light that is not collected by the microlens 35 and travels toward the R pixel 7R adjacent to the G pixel 7G (solid arrow L1), of the light incident on the microlens 35 of the G pixel 7G, is blocked by the light blocker 40 existing at the boundary part between the in-layer lenses 30. That is, the light that enters the photodiode 17 of the adjacent R pixel 7R from the side of the G pixel 7G if the light blocker 40 does not exist (dashed arrow L2) is incident on the light blocker 40 and reflected (solid arrows L1 and L3). This prevents the oblique light that causes color crosstalk between different-color pixels from entering the photodiode 17 and thus suppresses color crosstalk.

Furthermore, the light blocker 40 provided between the lenses of the in-layer lenses 30 in the solid-state imaging element 1 of the present embodiment is formed by a metal and thus can achieve high light blocking capability. Specifically, as a material to form a layer having light blocking capability, e.g. a resin material obtained by mixing carbon in a thermosetting resin will be available. However, such a resin material has low light blocking capability and cannot sufficiently suppress color crosstalk in some cases. In this regard, the light blocker 40 included in the solid-state imaging element 1 of the present embodiment can achieve high light blocking capability and can effectively reduce color crosstalk because it is formed by a metal.

Furthermore, because the light blocker 40 included in the solid-state imaging element 1 of the present embodiment is formed by a metal, high heat resistance against a high temperature process in the manufacturing process of the solid-state imaging element 1 can be easily obtained. Specifically, if the above-described resin material is used as the material of the light blocker 40, the light blocker 40 cannot withstand a high temperature process such as a step of performing reflow treatment in forming the microlenses 35 in some cases. In this regard, the light blocker 40 included in the solid-state imaging element 1 of the present embodiment can achieve high heat resistance and the application range can be widened because it is formed by a metal.

As shown in FIG. 2, the solid-state imaging element 1 of the present embodiment includes light blockers 45 between lenses also in the microlenses 35, which are on-chip lenses, in addition to the light blockers 40 provided between the lenses of the in-layer lenses 30. That is, in the solid-state imaging element 1 of the present embodiment, the light blocker 45 is provided at the boundary part between the microlenses 35 adjacent to each other.

The light blocker 45 is provided between the lenses of the microlenses 35 similarly to the light blocker 40 between the lenses of the in-layer lenses 30. The microlens 35 is a so-called gapless lens having no gap part in the relationship with the adjacent microlens 35. Also in such a gapless configuration, the light blocker 45 is provided at the concave part existing at the boundary part between the microlenses 35 adjacent to each other.

The light blocker 45 is formed by using a metal as its material similarly to the light blocker 40 between the lenses of the in-layer lenses 30. That is, as the metal to form the light blocker 45, e.g. any of W (tungsten), Al (aluminum), Ag (silver), Au (gold), Ru (ruthenium), Ti (titanium), etc. or an alloy containing at least two kinds of metals among these metals is used.

By providing the light blocker 45 also between the lenses of the microlenses 35 in addition to the light blocker 40' between the lenses of the in-layer lenses 30 in this manner, oblique light that causes color crosstalk between different-color pixels can be effectively prevented from entering the photodiode 17 and the effect of reduction in color crosstalk can be enhanced. Furthermore, the light blocker 45 can easily achieve high light blocking capability and high heat resistance against a high temperature process because it is formed by using a metal similarly to the light blocker 40 between the lenses of the in-layer lenses 30.

Next, one example of the result of optical simulation about the solid-state imaging element 1 of the present embodiment will be described. In the present example, as the simulation conditions, the cases in which the incident angle of green incident light transmitted through the green color filter 27G was 0° (vertical direction, see arrow X0) and was 10° (see arrow X1) as shown in FIG. 3 were used regarding each of the case in which the light blocker 40 was provided between the lenses of the in-layer lenses 30 like in the solid-state imaging element 1 of the present embodiment (defined as "present embodiment example") and the case in which the light blocker 40 was not provided between the lenses of the in-layer lenses 30 (defined as "comparative example"). Furthermore, W (tungsten) was employed as the material of the light blocker 40. Under such conditions, simulation about the respective values of the color crosstalk rate (R pixel sensitivity/G pixel sensitivity [%]) and the sensitivity was performed.

Figure 4:
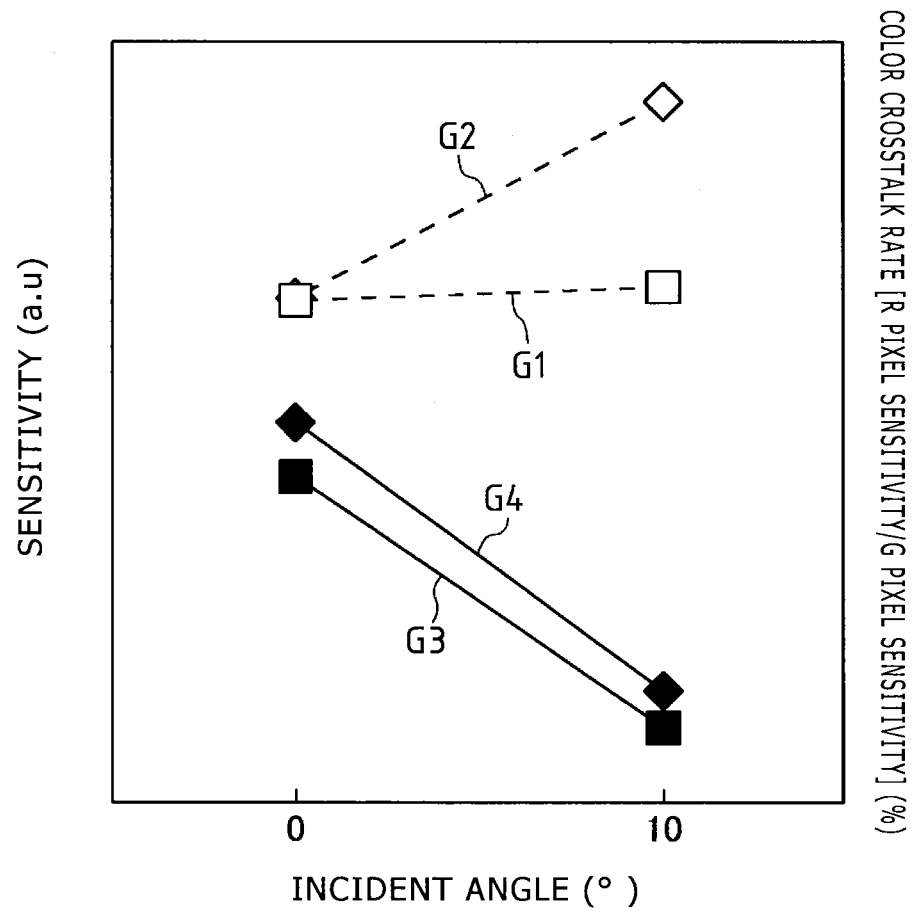
FIG. 4 is a diagram showing one example of a simulation result of the solid-state imaging element according to one embodiment of the present technique.

FIG. 4 shows the result of this simulation. In FIG. 4, graphs G1 and G2 indicated by dashed lines show the simulation result about the color crosstalk rate. The graph G1 shows the present embodiment example and the graph G2 shows the comparative example. Furthermore, in FIG. 4, graphs G3 and G4 indicated by solid lines show the simulation result about the sensitivity. The graph G3 shows the present embodiment example and the graph G4 shows the comparative example.

As is understood from the graphs G1 and G2 in FIG. 4 regarding the color crosstalk rate, if the incident angle of the incident light is 0°, the value of the color crosstalk rate is substantially the same between the present embodiment example and the comparative example. On the other hand, if the incident angle of the incident light is 10°, the color crosstalk rate greatly rises in the comparative example (graph G2) whereas the rise of the color crosstalk rate is slight in the present embodiment example (graph G1). That is, the color crosstalk rate is decreased by disposing the light blocker 40 between the lenses of the in-layer lenses 30. Specifically, a result that the amount of decrease in the color crosstalk rate in the present embodiment example from the comparative example was about 2% was obtained.

As is understood from the graphs G3 and G4 in FIG. 4 regarding the sensitivity, the sensitivity of the present embodiment example (graph G3) is slightly lower than that of the comparative example (graph G4). Furthermore, in both of the present embodiment example (graph G3) and the comparative example (graph G4), the sensitivity is lower when the incident angle of the incident light is 0° than when the incident angle is 10°. The degree of this sensitivity lowering is substantially the same between the present embodiment example (graph G3) and the comparative example (graph G4). That is, although the sensitivity is lowered by disposing the light blocker 40 between the lenses of the in-layer lenses 30, the amount of this lowering is slight. Specifically, a result that the amount of sensitivity lowering in the present embodiment example from the comparative example was about 1% was obtained.

As above, by the present simulation, the result was obtained that color crosstalk can be reduced without causing large sensitivity lowering, i.e. with the sensitivity nearly kept, by providing the light blocker 40 between the lenses of the in-layer lenses 30 like in the solid-state imaging element 1 of the present embodiment.

MODIFICATION EXAMPLE

Figure 5:
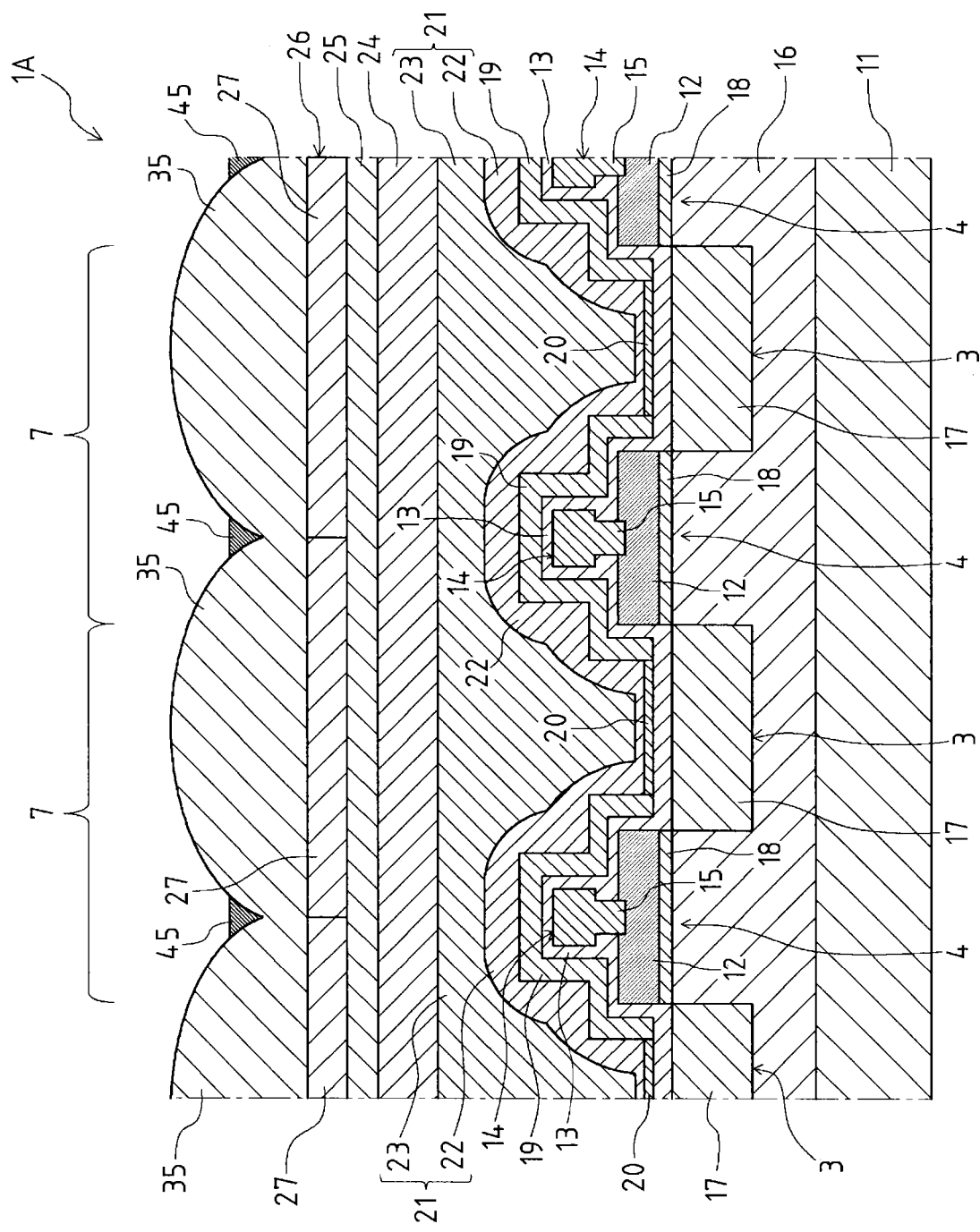
FIG. 5 is a sectional view showing a modification example of the solid-state imaging element according to one embodiment of the present technique.

A modification example of the solid-state imaging element 1 of the present embodiment will be described with use of FIG. 5. As shown in FIG. 5, a solid-state imaging element 1A of the present example is different from the solid-state imaging element 1 shown in FIG. 2 in that it does not include the in-layer lens 30. Specifically, in the solid-state imaging element 1A of the present example, the passivation film 24 is provided on the waveguide 21 and the color filter layer 26 and the plural microlenses 35 are provided over the passivation film 24 with the intermediary of the planarization film 25.

Furthermore, in the solid-state imaging element 1A of the present example, the light blocker 45 is provided at the boundary part between the microlenses 35 adjacent to each other. That is, the solid-state imaging element 1A of the present example does not have the in-layer lens and thus includes only the light blocker 45 provided at the boundary part of the microlenses 35 adjacent to each other as the light blocker between lenses between the pixels 7 adjacent to each other.

Also by the configuration including the light blocker 45 only at the boundary part between the microlenses 35 adjacent to each other in this manner, the above-described color crosstalk reduction effect can be achieved. It is also possible to employ a configuration including the light blocker 40 or 45 only either one of between the lenses of the in-layer lenses 30 and between the lenses of the microlenses 35 in the configuration including the in-layer lenses 30 as shown in FIG. 2.

[Method for Manufacturing Solid-State Imaging Element]

As a method for manufacturing the solid-state imaging element 1 according to the present embodiment, a method for forming the light blocker 40 provided between the lenses of the in-layer lenses 30 (hereinafter, referred to as the "light blocker 40 of the in-layer lens 30") and the light blocker 45 provided between the lenses of the microlenses 35 (hereinafter, referred to as the "light blocker 45 of the microlens 35") will be described. The light blocker 40 of the in-layer lens 30 and the light blocker 45 of the microlens 35 can be formed by a common method. Therefore, in the following, how to form the light blocker 40 of the in-layer lens 30 will be mainly described.

(Forming of Lens)

Figure 6A:
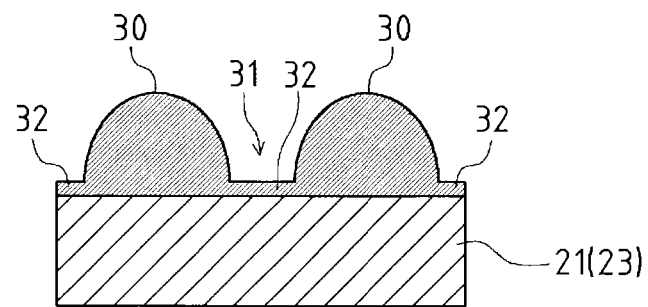
FIGS. 6A to 6C are explanatory diagrams about a method for manufacturing the solid-state imaging element according to one embodiment of the present technique.

In forming the light blocker 40 of the in-layer lens 30, first a step of forming the in-layer lenses 30 is carried out. As shown in FIG. 6A, in the case of the solid-state imaging element 1 of the present embodiment, the plural in-layer lenses 30 corresponding to the light receiving parts 3 of the respective pixels 7 are formed on the waveguide 21, specifically on the surface of the core layer 23 configuring the waveguide 21.

The plural in-layer lenses 30 are formed by a method that is publicly known in the technical field of the solid-state imaging element, such as a reflow method. In the state in which the in-layer lenses 30 have been formed, the gap part 31 exists at the boundary part between the in-layer lenses 30 adjacent to each other. Furthermore, the flat part 32 linking the bottoms of the in-layer lenses 30 to each other is formed together with the in-layer lenses 30.

The in-layer lenses 30 are formed by using a material having a refractive index higher than that of the material of the layer or film formed on the in-layer lenses 30. Specifically, when the refractive index of the material of the in-layer lenses 30 is defined as n1 and the refractive index of the material of the layer or film formed on the in-layer lenses 30 is defined as n2, a material satisfying a relationship of $n1>n2$ is used as the material of the in-layer lenses 30. This relationship of the refractive index is a condition for allowing the in-layer lens 30 to obtain a function as an optical element that refracts light and collects the light onto the photodiode 17 located below the in-layer lens 30.

In the configuration in which the passivation film 24 is formed on the in-layer lenses 30 like the solid-state imaging element 1 of the present embodiment, for example if the material of the passivation film 24 is a $SiO_2$ film (silicon oxide film), the in-layer lenses 30 are formed by SiN (silicon nitride). When the wavelength of light is 550 nm, the refractive index of $SiO_2$ (n2) is 1.4 to 1.5 and the refractive index of SiN (n1) is a value in a range of about 1.8 to 2.1 depending on the fabrication method and so forth. If the passivation film 24 is omitted and the planarization film 25 is formed on the in-layer lenses 30 as described above, the in-layer lenses 30 are formed by SiN whereas the planarization film 25 is formed by e.g. an organic applied film of an acrylic resin. When the wavelength of light is 550 nm, the refractive index of the organic applied film (n2) is 1.4 to 1.5.

The material of the in-layer lens 30 is not limited to the above-described examples and an appropriate material is employed based on the relationship of the refractive index with the layer or film formed on the in-layer lens 30, and so forth. Furthermore, by using an organic material such as a resin as the material of the in-layer lens 30, the refractive index can be adjusted to about 1.6 based on the fabrication method and so forth. However, in view of achievement of heat resistance against a high temperature process, it is preferable that the material of the in-layer lens 30 be an inorganic material such as SiN (silicon nitride).

If a low temperature oxidation (LTO) film is employed as the film formed on the in-layer lenses 30, the refractive index (n2) can be suppressed to about 1.3. Thus, the selection range of the material of the in-layer lens 30 can be widened in terms of the refractive index. Furthermore, a vacuum layer may be employed as the layer formed on the in-layer lenses 30. In this case, the refractive index of the vacuum layer (n2) is 1.

In the case of the microlens 35, which is an on-chip lens, the microlenses 35 are formed corresponding to the respective color filters 27 on the color filter layer 26 in the step of forming the lenses. In this case, the air (atmosphere) exists on the microlenses 35 and therefore a material having a refractive index higher than that of the air is used as the material of the microlens 35.

(Film Deposition of Light Blocking Layer)

Figure 6B:
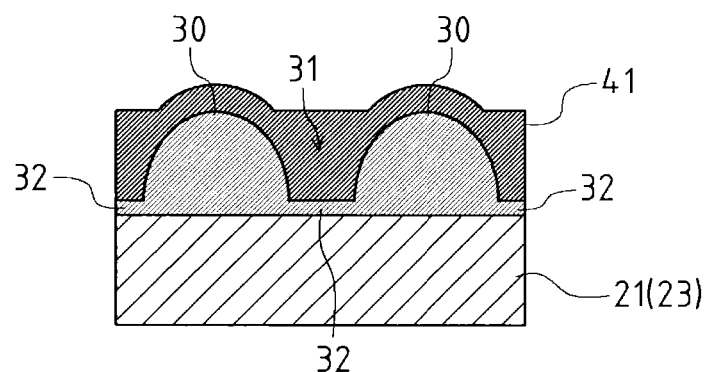

Next, a step of forming a light blocking layer on the in-layer lenses 30 is carried out. Specifically, as shown in FIG. 6B, film deposition is performed on the in-layer lenses 30 formed on the waveguide 21 by using a material having light blocking capability (hereinafter, referred to as the "light blocking material") and thereby a light blocking layer 41 is formed.

In the step of forming the light blocking layer 41, the light blocking material to form the light blocker 40 is so deposited as to fill the gap part 31 between the in-layer lenses 30 adjacent to each other, so that the light blocking layer 41 is formed. The light blocking layer 41 is deposited by using, as the light blocking material, e.g. any one kind of W (tungsten), Al (aluminum), Ag (silver), Au (gold), Ru (ruthenium), Ti (titanium), etc. or an alloy containing at least two kinds of metals among these metals. However, the light blocking material to form the light blocking layer 41 is not limited to the metal and e.g. a resin material obtained by mixing carbon in a thermosetting resin may be employed.

The light blocking layer 41 is so formed as to totally cover the plural in-layer lenses 30 and the flat parts 32 existing at the boundary part between them. Therefore, the top surface of the light blocking layer 41 has e.g. a convex shape that follows the shape of the in-layer lenses 30.

As the method for depositing the light blocking layer 41, e.g. a sputtering method or a chemical vapor deposition (CVD) method is used. The sputtering method is preferable in that high adhesion of the light blocking layer 41 to the in-layer lenses 30 and the flat parts 32 is obtained. The CVD method is preferable in that high filling capability of the metal material to form the light blocking layer 41 for the gap part 31 is obtained. So, the following method can be employed in the step of forming the light blocking layer 41.

First, by the sputtering method, the light blocking material to form the light blocking layer 41 is deposited on the group of the in-layer lenses 30 including the flat parts 32. Thereby, high adhesion is obtained. Next, by the CVD method, the film deposition of the light blocking material to form the light blocking layer 41 is continued. Thereby, the light blocking layer 41 is formed with achievement of high filling capability for the gap part 31. In this case, the step of forming the light blocking layer 41 has a first film deposition step of depositing the light blocking material on the in-layer lenses 30 by sputtering and a second film deposition step of further depositing the light blocking material on the light blocking material deposited on the in-layer lenses 30 by CVD after the first step. By employing the two-stage film deposition method as the combination of both of sputtering method and CVD method in this manner, advantages of both can be obtained and favorable film deposition characteristics about the light blocking layer 41 are obtained.

The adhesion of the material of the light blocking layer 41 to the material of the in-layer lens 30 is affected by the combination of the material of the in-layer lens 30 and the material of the light blocking layer 41 besides the method of the film deposition of the light blocking layer 41. Therefore, in selection of the material of the light blocking layer 41, the adhesion associated with the combination with the material of the in-layer lens 30 is taken into consideration.

(Etching)

Figure 6C:
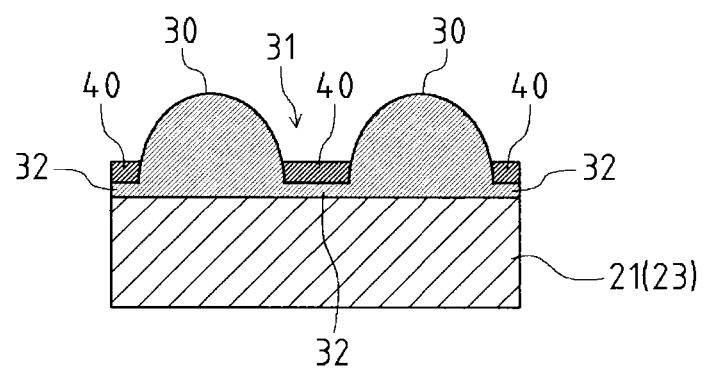

Then, by partially removing the light blocking layer 41 formed on the in-layer lenses 30 by etching, a step of forming the light blocker 40 of the in-layer lens 30 by the light blocking material to form the light blocking layer 41 is carried out. Specifically, as shown in FIG. 6C, the light blocking layer 41 is so etched that the light blocking material is left at the boundary part between the in-layer lenses 30 adjacent to each other. Thereby, the light blocker 40 composed of the light blocking material is formed at the boundary part between the in-layer lenses 30 adjacent to each other.

In this etching step, the light blocking layer 41 is partially removed in such a manner that the light blocking layer 41 with a predetermined film thickness is left on the flat parts 32 between the lenses of the in-layer lenses 30 and the light blockers 40 are formed by the material of the light blocking layer 41. At this time, the etching is so performed that the light blocking layer 41 is not left on the in-layer lenses 30 and the in-layer lenses 30 are not removed.

To perform such selective etching, an etching condition that provides high etching selectivity between the material of the in-layer lens 30 and the material of the light blocking layer 41 is employed. For example, if the material of the in-layer lens 30 is SiN (silicon nitride) and the material of the light blocking layer 41 is tungsten, an etching condition that provides high etching selectivity between SiN and tungsten is employed.

As the etching condition that provides high etching selectivity between the material of the in-layer lens 30 and the material of the light blocking layer 41, e.g. the following condition is used. As the etching gas, a mixed gas of $SF_6$ (sulfur hexafluoride), $Cl_2$ (chlorine), $O_2$ (oxygen), and $N_2$ (nitrogen) is used. The respective gases are used at the following flow rates: 100 [ml/min] for $SF_6$; 50 [ml/min] for $Cl_2$; 10 [ml/min] for $O_2$; and 50 [ml/min] for $N_2$. The pressure of the treatment atmosphere is set to 0.5 [Pa]. The source power is set to about 1000 [W] and the bias power applied to the wafer side (side of the semiconductor substrate 11) is set to about 25 [W]. The temperature of the stage on which the etching treatment target is placed is set to about 60[° C.]. The final film thickness of the light blocker 40 is adjusted by time control in the etching or end point detection. The etching method includes dry etching using an etching gas and wet etching as long as the method can satisfy the etching condition that provides high etching selectivity between the material of the in-layer lens 30 and the material of the light blocking layer 41, and an appropriate etching method is used.

In terms of ensuring the lens function of the in-layer lens 30, it is more preferable that the film thickness of the light blocking layer 41 left on the flat part 32, i.e. the film thickness of the light blocker 40, be smaller. However, the small film thickness of the light blocker 40 is in a trade-off relationship with ensuring the light blocking function by the light blocker 40. Therefore, it is preferable to optimally design the amount of removal of the light blocking layer 41 in this etching step, i.e. the film thickness of the light blocking layer 41 left on the flat part 32 (film thickness of the light blocker 40), for each of the materials of the in-layer lens 30 and the light blocking layer 41 and the shape of the in-layer lens 30.

In the above-described manner, the light blocker 40 of the in-layer lens 30 included in the solid-state imaging element 1 of the present embodiment is formed. According to the method for manufacturing the solid-state imaging element 1 in accordance with the present embodiment including the above-described respective steps, the light blocker 40 can be formed in a self-aligned manner in providing the light blocker 40 at the boundary part between the lenses of the in-layer lenses 30 provided corresponding to the light receiving parts 3 of the respective pixels 7. Thus, the accuracy of pattern alignment between the in-layer lens 30 and the light blocker 40 can be enhanced and it is possible to easily respond to microminiaturization and increase in the number of pixels.

Specifically, according to the method for manufacturing the solid-state imaging element 1 in accordance with the present embodiment, the part buried in the gap part 31, of the light blocking layer 41, which is formed through burying of a light blocking material into the gap part 31 between the lenses of the in-layer lenses 30 in the step of forming the light blocking layer 41, is formed as the light blocker 40 provided on the flat part 32. Therefore, the shape of the gap part 31 and the flat part 32 formed together with the in-layer lens 30 in the step of forming the in-layer lens 30 is utilized as the shape of the part where the light blocker 40 is formed in the later step. Thus, the light blocker 40 can be formed between the lenses of the in-layer lenses 30 without performing positional alignment with the in-layer lens 30. As above, according to the method for manufacturing the solid-state imaging element 1 in accordance with the present embodiment, the light blocker 40 can be formed in a self-aligned manner.

If a light blocking film is deposited after the in-layer lenses 30 are formed and the light blocker is formed by patterning based on e.g. photolithography, pattern positional alignment with the in-layer lens 30 is necessary and it is difficult to obtain high accuracy of pattern alignment between the in-layer lens 30 and the light blocker. Thus, if the light blocker is formed by patterning, it is difficult to respond to microminiaturization and increase in the number of pixels in the solid-state imaging element. In this regard, according to the method for manufacturing the solid-state imaging element 1 in accordance with the present embodiment, the light blocker 40 can be formed in a self-aligned manner as described above. Thus, high accuracy of pattern alignment between the in-layer lens 30 and the light blocker 40 can be obtained and it is easy to respond to microminiaturization and increase in the number of pixels.

Furthermore, the method of forming the light blocker by patterning based on e.g. photolithography needs a step of forming a mask and so forth and thus causes large increase in the number of steps. In this regard, in the method for manufacturing the solid-state imaging element 1 according to the present embodiment, merely the following two steps are added to the step of forming the in-layer lenses 30: the step of forming the light blocking layer 41 and the step of etching to partially remove the light blocking layer 41. Thus, the method does not cause large increase in the number of steps and is advantageous in terms of the cost.

Furthermore, in the method for manufacturing the solid-state imaging element 1 according to the present embodiment, by using e.g. a metal such as tungsten as the material of the light blocker 40, high light blocking capability can be achieved and color crosstalk can be effectively reduced. In addition, using a metal as the material of the light blocker 40 can achieve high heat resistance against a high temperature process and widen the application range.

The light blocker 45 of the microlens 35 can also be formed by a method similar to the above-described respective steps and the above-described effects can be achieved. Specifically, in the case of the light blocker 45 of the microlens 35, according to the method for manufacturing the solid-state imaging element 1 in accordance with the present embodiment, the light blocker 45 can be formed in a self-aligned manner in providing the light blocker 45 at the boundary part between the lenses of the microlenses 35 provided corresponding to the light receiving parts 3 of the respective pixels 7. Thus, the accuracy of pattern alignment between the microlens 35 and the light blocker 45 can be enhanced and it is possible to easily respond to microminiaturization and increase in the number of pixels.

However, the incident light corresponding to the gap part 31 of the in-layer lens 30 is nearly limited to a color crosstalk component. Therefore, in terms of prevention of sensitivity lowering due to vignetting of the incident light, providing the light blocker 40 for the in-layer lens 30 is more effective than providing the light blocker 45 for the microlens 35.

Specifically, the light blocker 45 provided between the lenses of the microlenses 35 often causes blocking of part of incident light, i.e. so-called vignetting of the incident light, and the vignetting of the incident light causes sensitivity lowering. In this regard, in the case of the in-layer lens 30, the incident light on the gap part 31 is nearly limited to a color crosstalk component as described above. Therefore, in terms of keeping the sensitivity, the light blocker 40 of the in-layer lens 30 is preferentially employed compared with the light blocker 45 of the microlens 35.

Modification Example 1

Figure 7A:
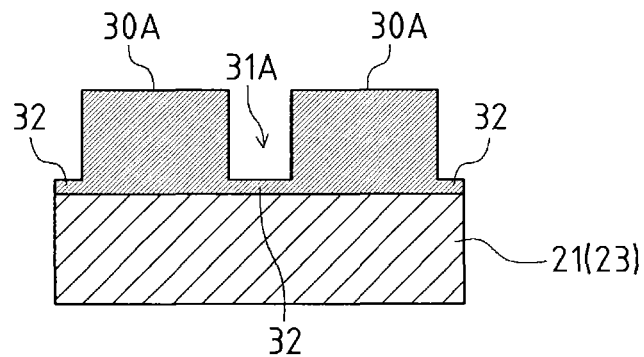
FIGS. 7A to 7C are explanatory diagrams about a modification example of the method for manufacturing the solid-state imaging element according to one embodiment of the present technique.
Figure 7B:
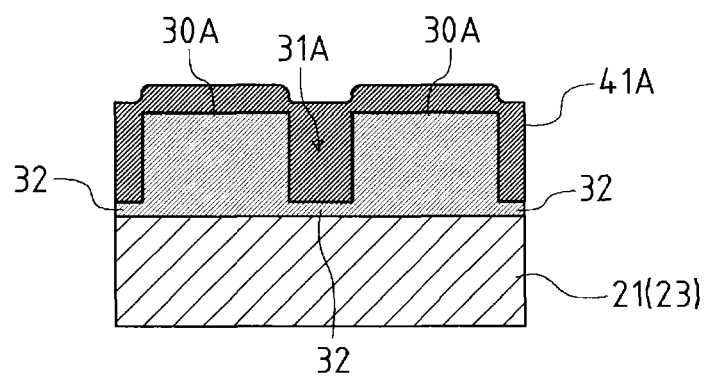
Figure 7C:
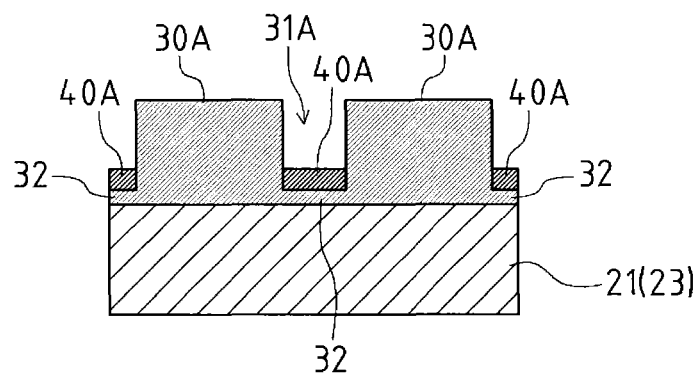

A modification example of the method for manufacturing the solid-state imaging element 1 according to the present embodiment will be described with use of FIGS. 7A to 7C. As shown in FIGS. 7A to 7C, in the present modification example, in-layer lenses 30A formed in the step of forming lenses are formed as digital lenses having a rectangular sectional shape.

In the present modification example, a trench-like gap part 31A having a rectangular shape in sectional view is formed as the concave part formed at the boundary part between the in-layer lenses 30A adjacent to each other. Also when the in-layer lenses 30A are digital lenses in this manner, a light blocker 40A can be formed on the flat part 32 as the bottom in the gap part 31A by a method similar to the above-described respective steps.

Specifically, as shown in FIG. 7A, the plural in-layer lenses 30A corresponding to the light receiving parts 3 of the respective pixels 7 are formed on the waveguide 21. Next, as shown in FIG. 7B, film deposition is performed on the in-layer lenses 30A formed on the waveguide 21 by using a light blocking material and thereby a light blocking layer 41A is formed. In the step of forming this light blocking layer 41A, the light blocking material to form the light blocker 40A is so deposited as to fill the gap part 31A between the in-layer lenses 30A adjacent to each other, so that the light blocking layer 41A is formed. Then, as shown in FIG. 7C, the light blocking layer 41A is so etched that the light blocking material is left at the boundary part between the in-layer lenses 30A adjacent to each other. Thereby, the light blocker 40A composed of the light blocking material is formed at the boundary part between the in-layer lenses 30A adjacent to each other.

In the above-described manner, also in the configuration including the in-layer lenses 30A formed as digital lenses, the light blocker 40A can be formed between the lenses similarly to the case of the in-layer lens 30 having a substantially elliptical shape or a substantially circular shape in sectional view as described above, and similar effects can be achieved.

Modification Example 2

Figure 8A:
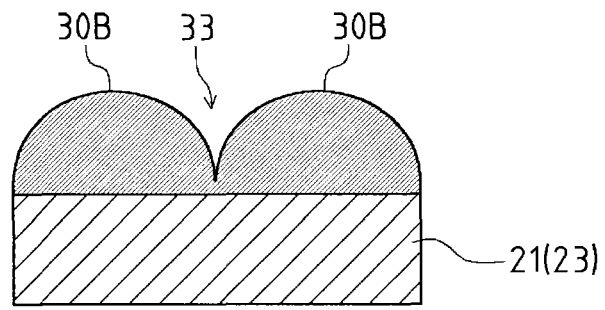
FIGS. 8A to 8C are explanatory diagrams about a modification example of the method for manufacturing the solid-state imaging element according to one embodiment of the present technique.
Figure 8B:
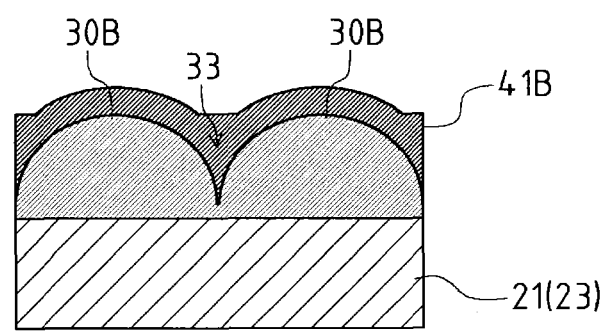
Figure 8C:
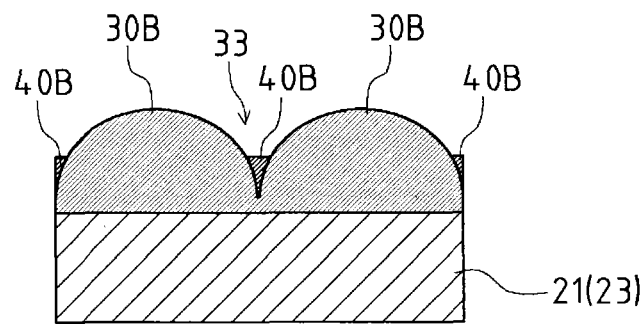

Another modification example of the method for manufacturing the solid-state imaging element 1 according to the present embodiment will be described with use of FIGS. 8A to 8C. As shown in FIGS. 8A to 8C, in the present modification example, in-layer lenses 30B formed in the step of forming lenses are gapless lenses having no gap between the adjacent in-layer lenses 30B.

In the present modification example, as the concave part formed at the boundary part between the in-layer lenses 30B adjacent to each other, a trench part 33 having a substantially V-character shape in sectional view is formed by end parts of curves having a substantially elliptical shape or a substantially circular shape in sectional view. That is, in the present modification example, the gap part 31 and the flat part 32 shown in FIGS. 6A to 6C do not exist between the lenses adjacent to each other and the in-layer lenses 30B adjacent to each other are continuously formed. Also when the in-layer lenses 30B are gapless lenses in this manner, a light blocker 40B can be formed on the trench part 33 by a method similar to the above-described respective steps.

Specifically, as shown in FIG. 8A, the plural in-layer lenses 30B corresponding to the light receiving parts 3 of the respective pixels 7 are formed on the waveguide 21. Next, as shown in FIG. 8B, film deposition is performed on the in-layer lenses 30B formed on the waveguide 21 by using a light blocking material and thereby a light blocking layer 41B is formed. In the step of forming this light blocking layer 41B, the light blocking material to form the light blocker 40B is so deposited as to fill the trench part 33 between the in-layer lenses 30B adjacent to each other, so that the light blocking layer 41B is formed. Then, as shown in FIG. 8C, the light blocking layer 41B is so etched that the light blocking material is left at the boundary part between the in-layer lenses 30B adjacent to each other. Thereby, the light blocker 40B composed of the light blocking material is formed at the boundary part between the in-layer lenses 30B adjacent to each other.

In the above-described manner, also in the configuration including the in-layer lenses 30B formed as gapless lenses, the light blocker 40B can be formed between the lenses similarly to the case of the in-layer lens 30 having a substantially elliptical shape or a substantially circular shape in sectional view as described above, and similar effects can be achieved.

Furthermore, if the in-layer lenses 30B formed in the step of forming lenses are gapless lenses like in the present modification example, the concave part between the lenses is shallower compared with the case in which a gap part (see the gap part 31 in FIG. 6A) exists between the lenses. Thus, e.g. in etching the light blocking layer 41B by dry etching, the etching gas sufficiently reaches even the light blocking layer 41B existing at the concave part between the lenses and the light blocking layer 41B at the concave part between the lenses can be surely removed.

Figure 9:
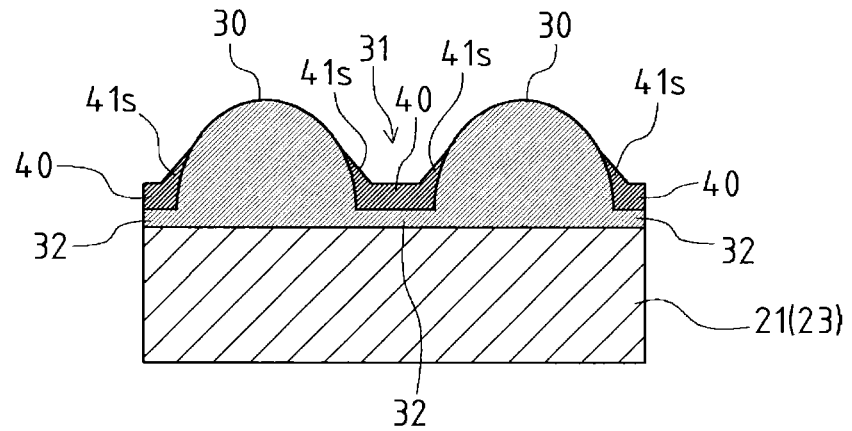
FIG. 9 is an explanatory diagram about a modification example of the method for manufacturing the solid-state imaging element according to one embodiment of the present technique.

Specifically, if the gap part 31 exists between the lenses of the in-layer lenses 30 as shown in FIG. 6A, the etching gas does not sufficiently go into the gap part 31 in the step of etching to remove the light blocking layer 41. As a result, for example as shown in FIG. 9, sidewalls 41s by the light blocking layer 41 that is not removed are formed around the in-layer lenses 30 over the light blocker 40. The sidewalls 41s by the light blocking material formed around the in-layer lenses 30 in this manner are not preferable in terms of ensuring the sensitivity. In this regard, in the case of the gapless in-layer lens 30B like in the present modification example, the light blocking layer 41B existing in the concave part between the lenses is also sufficiently exposed to the etching gas. Thus, the sidewall 41s is not formed and the sensitivity can be ensured.

Modification Example 3

In the present modification example, in the step of forming the light blocking layer 41, a step of forming an adhesion layer for allowing adhesion of the light blocking material to the material to form the in-layer lens 30 is carried out.

Figure 10A:
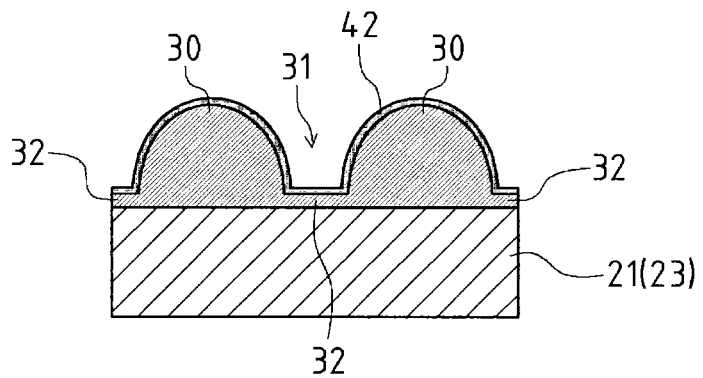
FIGS. 10A and 10B are explanatory diagrams about a modification example of the method for manufacturing the solid-state imaging element according to one embodiment of the present technique.

Specifically, as shown in FIG. 10A, an underlying film 42 as the adhesion layer is formed on the in-layer lenses 30 formed in the step of forming lenses before the light blocking layer 41 is formed. The underlying film 42 is conformally formed in such a manner as to totally cover the plural in-layer lenses 30 and the flat parts 32 existing at the boundary part between them. The underlying film 42 is formed by e.g. a sputtering method.

Figure 10B:
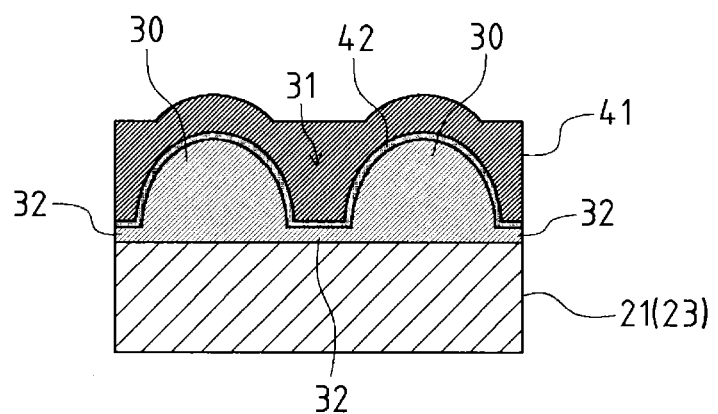

After the underlying film 42 is formed, as shown in FIG. 10B, the light blocking material to form the light blocker 40 (see FIG. 6C) is deposited on the underlying film 42 in such a manner as to fill the gap part 31 between the in-layer lenses 30 adjacent to each other. Thereby, the light blocking layer 41 is formed.

As described above, the adhesion of the material of the light blocking layer 41 to the material of the in-layer lens 30 is affected by the combination of the materials of the in-layer lens 30 and the light blocking layer 41. So, like in the present modification example, the underlying film 42 may be formed by using a material having favorable adhesion to both the material of the in-layer lens 30 and the material of the light blocking layer 41 depending on the combination of the materials of the in-layer lens 30 and the light blocking layer 41.

For example, if the material of the in-layer lens 30 is SiN (silicon nitride) and the material of the light blocking layer 41 is tungsten, the underlying film 42 is deposited by using $SiO_2$ as its material. That is, in this case, one layer of the underlying film 42 composed of $SiO_2$ is formed on a SiN film including the in-layer lenses 30 and the flat parts 32 and the light blocking layer 41 is formed on this underlying film 42. Examples of the material of the light blocking layer 41 include Al (aluminum) besides W (tungsten), and examples of the material of the underlying film 42 include Ti (titanium), $Al_2O_3$ (aluminum oxide), $HfO_2$ (hafnium oxide), and $TiO_2$ (titanium dioxide) besides $SiO_2$. These materials are used as the materials of the light blocking layer 41 and the underlying film 42 in an appropriate combination.

As above, in the present modification example, the step of forming the light blocking layer 41 has the step of forming the underlying film 42 for allowing adhesion of the light blocking material to the material to form the in-layer lens 30, and the light blocking layer 41 formed over the in-layer lenses 30 has a multilayer structure including the underlying film 42 interposed between the light blocking layer 41 and the in-layer lenses 30. This can enhance the adhesion of the light blocker 40 formed between the lenses of the in-layer lenses 30 to the material of the in-layer lens 30. In the present embodiment, regarding the light blocker 40 finally formed on the bottom of the gap part 31, mainly adhesion to the flat part 32 can be enhanced through forming of the light blocker 40 on the underlying film 42.

[Second Embodiment]

A second embodiment of the present technique will be described. In the respective embodiments to be described below, description of the part common to the first embodiment is accordingly omitted through use of the same numeral and so forth, and different part will be intensively described. A method for manufacturing the solid-state imaging element 1 according to the present embodiment is different from the first embodiment in that it includes a step of forming an etching stopper film 51 on the in-layer lenses 30 between the step of forming the in-layer lenses 30 and the step of forming the light blocking layer 41.

Figure 11A:
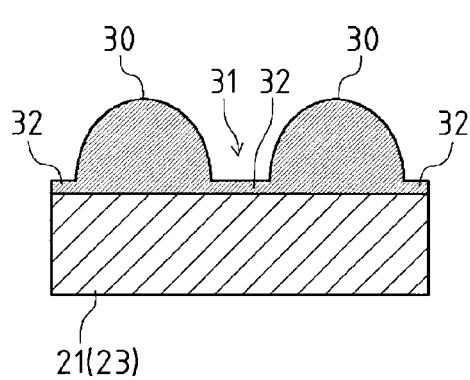
FIGS. 11A to 11D are explanatory diagrams about a method for manufacturing the solid-state imaging element according to a second embodiment of the present technique.

In the method for manufacturing the solid-state imaging element 1 of the present embodiment, as shown in FIG. 11A, first the in-layer lenses 30 are formed on the waveguide 21 by using e.g. SiN. Thereafter, as shown in FIG. 11B, the etching stopper film 51 is formed on the in-layer lenses 30.

The etching stopper film 51 is a film for preventing etching of the in-layer lens 30 in etching for the light blocking layer 41 in the step of forming the light blocker 40. Therefore, the etching stopper film 51 is formed as a film having different etching characteristics from the light blocking layer 41. That is, the etching stopper film 51 is formed by a material having high etching selectivity with respect to the light blocking material to form the light blocking layer 41.

The etching stopper film 51 is conformally formed in such a manner as to totally cover the plural in-layer lenses 30 and the flat parts 32 existing at the boundary part between them. The etching stopper film 51 is formed by e.g. a sputtering method. The etching stopper film 51 is formed with a film thickness of e.g. several tens to hundreds of nanometers. As the material to form the etching stopper film 51, e.g. $SiO_2$ (silicon oxide film) is used.

In the method for manufacturing the solid-state imaging element 1 according to the present embodiment, it is preferable to use a material having a refractive index that is lower than that of the material to form the in-layer lens 30 and higher than that of the material of the layer formed over the in-layer lenses 30 with the intermediary of the etching stopper film 51 as the material to form the etching stopper film 51. The layer formed over the in-layer lenses 30 with the intermediary of the etching stopper film 51 is the layer formed on the etching stopper film 51 formed on the in-layer lenses 30 in the solid-state imaging element 1. In the solid-state imaging element 1 of the present embodiment, this layer is the passivation film 24 (see FIG. 2).

As described above, the in-layer lenses 30 are formed by using a material having a refractive index higher than that of the material to configure the layer or film formed on the in-layer lenses 30, i.e. the material to form the passivation film 24. So, in the configuration in which the etching stopper film 51 is formed on the in-layer lenses 30 like in the present embodiment, it is preferable to select materials satisfying such a relationship that the in-layer lens 30, the etching stopper film 51, and the passivation film 24 are in decreasing order of the refractive index of the material.

That is, when the refractive indexes of the material to form the in-layer lens 30, the material to form the etching stopper film 51, and the material to configure the passivation film 24 formed on the in-layer lenses 30 are defined as n1, n2, and n3, respectively, preferably a material satisfying a relationship of n1>n2>n3 is used as the material to form the etching stopper film 51.

Specifically, for example when the material to form the in-layer lens 30 is SiN (silicon nitride) and the material to form the passivation film 24 is a $SiO_2$ film (silicon oxide film), SiON (silicon oxynitride film), which is a material having an intermediate refractive index with respect to SiN and $SiO_2$, is used as the material of the etching stopper film 51. When the wavelength of light is 550 nm, the refractive index of SiN (n1) can be adjusted in a range of about 1.8 to 2.1 depending on the fabrication method and so forth. In addition, the refractive index of SiON (n2) is about 1.5 to 1.8 and the refractive index of $SiO_2$ (n3) is 1.4 to 1.5.

Furthermore, for example when the material to form the in-layer lens 30 is SiN (silicon nitride) and a $SiO_2$ film (silicon oxide film) is used as the material to form the etching stopper film 51, a material having a refractive index lower than that of $SiO_2$ is used as the material to form the passivation film 24.

By using a material having a refractive index that is lower than that of the material of the in-layer lens 30 and higher than that of the material of the layer formed over the in-layer lenses 30 with the intermediary of the etching stopper film 51 as the material to form the etching stopper film 51 in this manner, the etching stopper film 51 can be made to function as an antireflection film against light incident on the in-layer lens 30. That is, the etching stopper film 51 can be made to serve also as the antireflection film by making the material to form the etching stopper film 51 satisfy the above-described refractive index condition with respect to the materials of the layer structures existing on and under the etching stopper film 51.

Figure 11C:
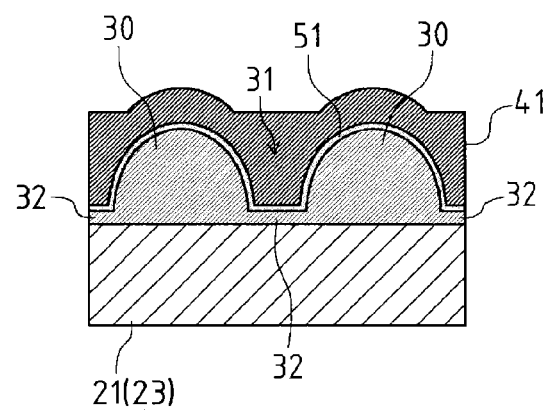
Figure 11B:
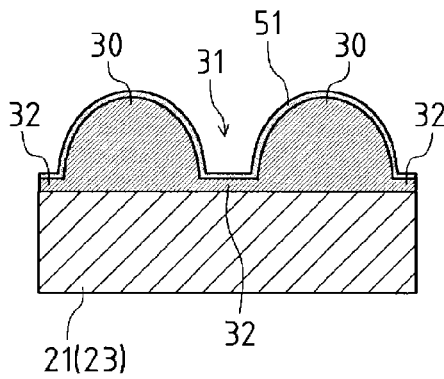

After the etching stopper film 51 is formed on the in-layer lenses 30 as shown in FIG. 11B, film deposition is performed on the etching stopper film 51 covering the in-layer lenses 30 by using a light blocking material and thereby the light blocking layer 41 is formed as shown in FIG. 11C. In the step of forming this light blocking layer 41, the light blocking material to form the light blocker 40 is deposited on the etching stopper film 51 by e.g. sputtering or CVD in such a manner as to fill the gap part 31 between the in-layer lenses 30 adjacent to each other, so that the light blocking layer 41 is formed.

Figure 11D:
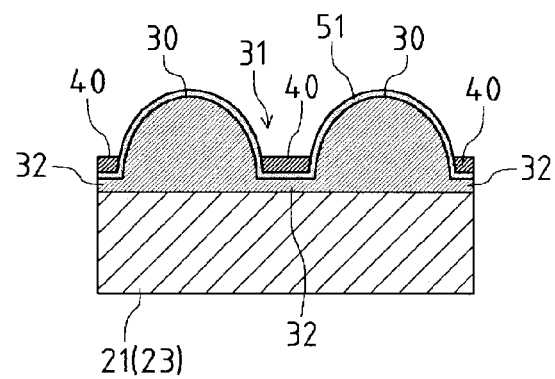

Then, as shown in FIG. 11D, the light blocking layer 41 is so etched that the light blocking material is left at the boundary part between the in-layer lenses 30 adjacent to each other. Thereby, the light blockers 40 composed of the light blocking material are formed at the boundary parts between the in-layer lenses 30 adjacent to each other. In the present embodiment, the light blockers 40 are formed on the etching stopper film 51 deposited on the in-layer lenses 30 and the flat parts 32.

In this etching step, the light blocking layer 41 is partially removed in such a manner that the light blocking layer 41 with a predetermined film thickness is left over the flat parts 32 between the lenses of the in-layer lenses 30 with the intermediary of the etching stopper film 51 and the light blockers 40 are formed by the material of the light blocking layer 41. At this time, the etching is so performed that the light blocking layer 41 is not left on the in-layer lenses 30 and the etching stopper film 51 is not removed.

To perform such selective etching, an etching condition that provides high etching selectivity between the material of the etching stopper film 51 and the material of the light blocking layer 41 is employed. That is, because the etching stopper film 51 is formed by using a material having high etching selectivity with respect to the light blocking material to form the light blocking layer 41 as described above, selective etching of the light blocking layer 41 can be performed. For example, if the material of the light blocking layer 41 is tungsten and the material of the etching stopper film 51 is SiON, an etching condition that provides high etching selectivity between tungsten and SiON is employed.

In the present embodiment, dry etching is performed as the etching and e.g. the following condition is used as its etching condition. As the etching gas, a mixed gas of $SF_6$ (sulfur hexafluoride), $Cl_2$ (chlorine), $O_2$ (oxygen), and $N_2$ (nitrogen) is used. The respective gases are used at the following flow rates: 100 [ml/min] for $SF_6$; 50 [ml/min] for $Cl_2$; 10 [ml/min] for $O_2$; and 50 [ml/min] for $N_2$. The pressure of the treatment atmosphere is set to 0.5 [Pa]. The source power is set to about 500 [W] and the bias power applied to the wafer side (side of the semiconductor substrate 11) is set to about 50 [W]. The temperature of the stage on which the etching treatment target is placed is set to about 25[° C.]. The final film thickness of the light blocker 40 is adjusted by time control in the etching or end point detection.

In the above-described manner, the light blocker 40 of the in-layer lens 30 included in the solid-state imaging element 1 of the present embodiment is formed. According to the method in which the step of forming the etching stopper film 51 is carried out between the step of forming the in-layer lenses 30 and the step of forming the light blocking layer 41 like the manufacturing method of the present embodiment, etching of the in-layer lens 30 in the etching step can be avoided irrespective of the etching selectivity between the material of the in-layer lens 30 and the light blocking material of the light blocking layer 41. That is, the manufacturing method of the present embodiment is preferably used when it is difficult to ensure high etching selectivity between the material of the in-layer lens 30 and the light blocking material of the light blocking layer 41.

[Third Embodiment]

A third embodiment of the present technique will be described. A method for manufacturing the solid-state imaging element 1 according to the present embodiment is different from the above-described respective embodiments in that a light blocking layer formed on the in-layer lenses 30 is conformally deposited and then a planarization resist film is applied on the light blocking layer.

In the method for manufacturing the solid-state imaging element 1 according to the present embodiment, as shown in FIG. 12A, first the in-layer lenses 30 are formed on the waveguide 21 by using e.g. SiN. Thereafter, as shown in FIG. 12B, the etching stopper film 51 is formed on the in-layer lenses 30.

Next, as shown in FIG. 12C, film deposition is performed on the etching stopper film 51 covering the in-layer lenses 30 by using a light blocking material and thereby a light blocking layer 41C is formed. In the present embodiment, the light blocking layer 41C is conformally deposited. That is, from the state in which the etching stopper film 51 is conformally formed in such a manner as to totally cover the plural in-layer lenses 30 and the flat parts 32 existing at the boundary part between them, the light blocking layer 41C is so deposited as to be stacked on the etching stopper film 51 and follow the shape of the in-layer lenses 30 and the flat parts 32.

As the method for conformally depositing the light blocking layer 41C, sputtering is preferably used. However, the method for depositing the light blocking layer 41C is not limited and another film deposition method such as CVD can be accordingly used.

Subsequently, as shown in FIG. 12D, a planarization resist film 61 is applied on the light blocking layer 41C conformally deposited. A publicly-known resist material can be used as the material of the planarization resist film 61. The planarization resist film 61 is formed to such a thickness that at least a flat surface 61a is formed. Therefore, the planarization resist film 61 is formed to a thickness larger than the height along the shape of the in-layer lens 30 regarding the light blocking layer 41C conformally deposited on the in-layer lenses 30 (see symbol D1).

Then, as shown in FIG. 12E, the light blocking layer 41C and the planarization resist film 61 are so etched that the light blocking material is left at the boundary part between the in-layer lenses 30 adjacent to each other. Thereby, the light blockers 40 composed of the light blocking material are formed at the boundary parts between the in-layer lenses 30 adjacent to each other.

In this etching step, the light blocking layer 41C is partially removed in such a manner that the light blocking layer 41C with a predetermined film thickness is left over the flat parts 32 between the lenses of the in-layer lenses 30 with the intermediary of the etching stopper film 51 and the light blockers 40 are formed by the material of the light blocking layer 41C. In addition, the planarization resist film 61 is totally removed. At this time, the etching is so performed that the planarization resist film 61 and the light blocking layer 41C are not left on the in-layer lenses 30 and the etching stopper film 51 is not removed.

To perform such selective etching, etch-back of the whole surface from the side of the flat surface 61a of the planarization resist film 61 is performed by dry etching in the present embodiment. Furthermore, an etching condition is employed that provides a ratio of 1 to 1 as the etching selectivity of the material of the planarization resist film 61 to the material of the light blocking layer 41C and provides high etching selectivity between the material of the etching stopper film 51 and the material of the light blocking layer 41C.

Specifically, the light blockers 40 with a predetermined film thickness are obtained between the lenses of the in-layer lenses 30 through uniform etching of the planarization resist film 61 and the light blocking layer 41C along the flat surface 61a. Therefore, the planarization resist film 61 and the light blocking layer 41C are etched with selectivity of 1 to 1. Furthermore, because the etching stopper film 51 should be left on the in-layer lenses 30, the light blocking layer 41C is selectively etched with the etching stopper film 51 left.

In the present embodiment, in order to perform etching of the planarization resist film 61 and the light blocking layer 41C with selectivity of 1 to 1, e.g. the following condition is used as the etching condition, differently from the etching condition shown as an example for the second embodiment. If the material of the light blocking layer 41C is W (tungsten) and the material of the etching stopper film 51 is $SiO_2$, a mixed gas of $SF_6$ (sulfur hexafluoride), $Cl_2$ (chlorine), and $O_2$ (oxygen) is used as the etching gas. The respective gases are used at the following flow rates: 30 [ml/min] for $SF_6$; 100 [ml/min] for $Cl_2$; and 50 [ml/min] for $O_2$. The source power is set to about 1000 [W] and the bias power is set to about 50 [W].

As described above, in the present embodiment, the light blocking material is conformally deposited in the step of forming the light blocking layer 41C, and the step of applying the planarization resist film 61 on the light blocking layer 41C is further carried out between the step of forming the light blocking layer 41C and the step of forming the light blockers 40. In the step of forming the light blockers 40, the planarization resist film 61 is etched together with the light blocking layer 41C.

According to the method for manufacturing the solid-state imaging element 1 in accordance with the present embodiment, even if sufficient filling capability of the light blocking material for the gap part 31 between the lenses of the in-layer lenses 30 is not obtained in the step of forming the light blocking layer 41C, it is possible to easily respond to this situation. That is, the method for manufacturing the present embodiment is preferably used if it is difficult to perform such film deposition as to fill the gap part 31 between the lenses of the in-layer lenses 30 in the step of forming the light blocking layer 41C. Examples of the case in which it is difficult to perform such film deposition as to fill the gap part 31 between the lenses of the in-layer lenses 30 includes the case in which the CVD method, by which high filling capability is obtained as described above, cannot be used because of instability in terms of the process.

Furthermore, the following collateral effect is also obtained according to the method for manufacturing the solid-state imaging element 1 in accordance with the present embodiment. In the solid-state imaging element 1, a wiring area exists around the imaging area 2, in which the pixels 7 are arranged. Thus, after forming of the light blocking layer 41C, the light blocking material to form the light blocking layer 41C is often left also in this peripheral wiring area of the imaging area 2. In such a case, the light blocking material in the peripheral wiring area needs to be removed by e.g. etching, with the imaging area 2 masked by resist.

In this regard, by employing the method for manufacturing the solid-state imaging element 1 according to the present embodiment, after the planarization resist film 61 is applied on the light blocking layer 41C, the etching for forming the light blockers 40 can be performed after the part of the planarization resist film 61 in the peripheral wiring area is removed by exposure in advance. This can eliminate the above-described step of removing the light blocking material in the peripheral wiring area.

[Fourth Embodiment]

A fourth embodiment of the present technique will be described. A method for manufacturing the solid-state imaging element 1 according to the present embodiment is different from the above-described third embodiment mainly in that it includes a step of forming a hard mask in the gap between the lenses of the in-layer lenses 30 on a conformal light blocking layer after conformally depositing the light blocking layer formed on the in-layer lenses 30.

Figure 13A:
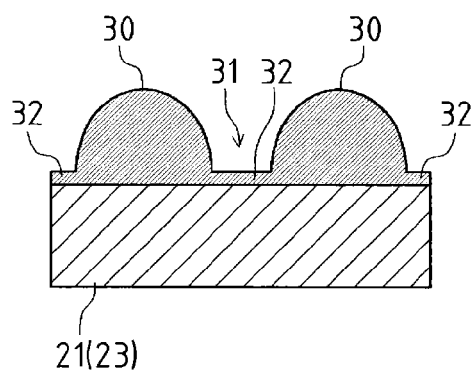
FIGS. 13A to 13E are explanatory diagrams about a method for manufacturing the solid-state imaging element according to a fourth embodiment of the present technique.

In the method for manufacturing the solid-state imaging element 1 according to the present embodiment, as shown in FIG. 13A, first the in-layer lenses 30 are formed on the waveguide 21 by using e.g. SiN. Thereafter, as shown in FIG. 13B, the etching stopper film 51 is formed on the in-layer lenses 30. Next, as shown in FIG. 13C, film deposition is conformally performed on the etching stopper film 51 covering the in-layer lenses 30 by using a light blocking material and thereby the light blocking layer 41C is formed.

Figure 13D:
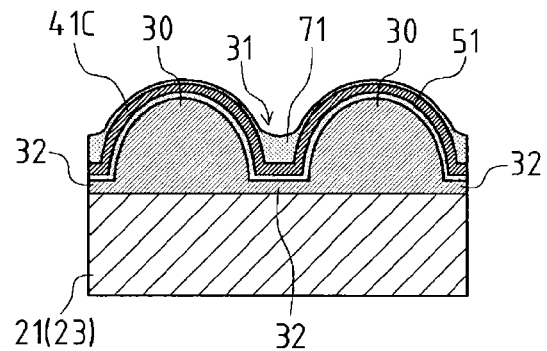
Figure 13B:
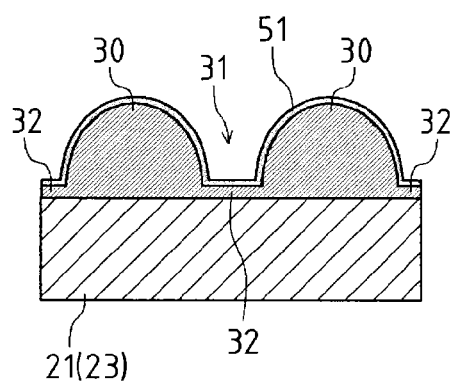

Subsequently, as shown in FIG. 13D, a hard mask 71 is formed on the light blocking layer 41C conformally deposited. The hard mask 71 functions as a hard mask in etching in the step of forming the light blockers 40 and is e.g. an oxide film.

The hard mask 71 is selectively formed in such a manner as to fill the gap part 31 at the boundary part between the in-layer lenses 30 adjacent to each other. Specifically, as shown in FIG. 13D, on the light blocking layer 41C in the gap part 31 between the lenses of the in-layer lenses 30, the hard mask 71 is formed to a position lower than the peak part of the light blocking layer 41C on the in-layer lens 30. At the part other than the gap part 31 on the light blocking layer 41C, the hard mask 71 is formed with a comparatively small thickness.

The hard mask 71 is formed through coating of a resin film as a spin-on-glass (SOG) film for example. Alternatively, the hard mask 71 is formed as borophosphosilicate glass (BPSG) or a silicon oxide film ($SiO_2$) by a CVD method with use of a tetraethoxysilane (TEOS) gas for example. More alternatively, the hard mask 71 is formed as a $SiO_2$-based CVD film by a bias high density plasma CVD method for example.

Figure 13E:
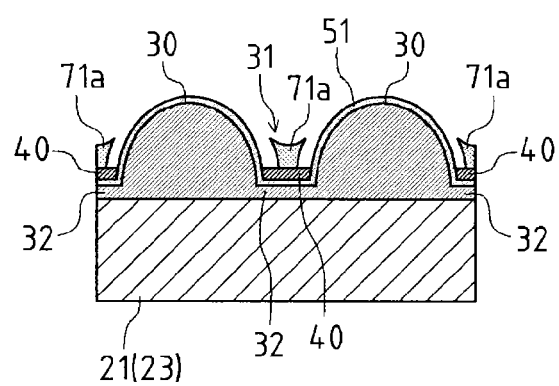
Figure 13C:
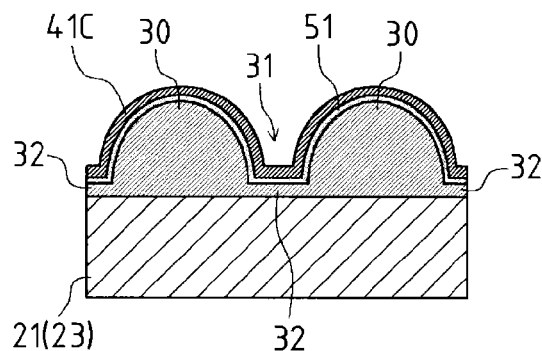

After the hard mask 71 is formed, as shown in FIG. 13E, the light blocking layer 41C and the hard mask 71 are so etched that the light blocking material is left at the boundary part between the in-layer lenses 30 adjacent to each other and thereby the light blockers 40 composed of the light blocking material are formed at the boundary parts between the in-layer lenses 30 adjacent to each other.

In this etching step, the light blocking layer 41C and the hard mask 71 are partially removed in such a manner that the light blocking layer 41C with a predetermined film thickness is left over the flat parts 32 between the lenses of the in-layer lenses 30 with the intermediary of the etching stopper film 51 and the light blockers 40 are formed by the material of the light blocking layer 41C. At this time, the light blocking layer 41C is etched after the comparatively-thin hard mask 71 formed on the light blocking layer 41C at the peak part of the in-layer lens 30 is removed ahead. Furthermore, the etching is so performed that the light blocking layer 41C is not left on the in-layer lenses 30 and the etching stopper film 51 is not removed.

To perform such selective etching, in the present embodiment, an etching condition that provides high etching selectivity between the material of the above-described etching stopper film 51 and the material of the light blocking layer 41C is employed. As shown in FIG. 13E, in the present embodiment, remaining films 71a of the hard mask 71 exist on the light blockers 40 after the etching step depending on the case.

As described above, in the present embodiment, the light blocking material is conformally deposited in the step of forming the light blocking layer 41C, and the step of forming the hard mask 71 at the boundary part between the in-layer lenses 30 on the light blocking layer 41C is further carried out between the step of forming the light blocking layer 41C and the step of forming the light blockers 40.

According to the method for manufacturing the solid-state imaging element 1 in accordance with the present embodiment, even if sufficient filling capability of the light blocking material for the gap part 31 between the lenses of the in-layer lenses 30 is not obtained in the step of forming the light blocking layer 41C and it is difficult to provide a ratio of 1 to 1 as the etching selectivity between the planarization resist film 61 and the light blocking layer 41C in the etching (see the third embodiment), it is possible to easily respond to this situation. That is, the manufacturing method of the present embodiment is preferably used if it is difficult to perform such film deposition as to fill the gap part 31 between the lenses of the in-layer lenses 30 in the step of forming the light blocking layer 41C and it is difficult to provide a ratio of 1 to 1 as the etching selectivity between the planarization resist film 61 and the light blocking layer 41C. Examples of the cause of the difficulty in providing a ratio of 1 to 1 as the etching selectivity between the planarization resist film 61 and the light blocking layer 41C include instability of the flow rate of the etching gas and the etching characteristics of the metal material to form the light blocking layer 41C.

Modification Example

A modification example of the method for manufacturing the solid-state imaging element 1 according to the present embodiment will be described. In the present modification example, a non-doped silicate glass (NSG) film is formed as the hard mask formed on the light blocking layer 41C conformally deposited.

In the case of employing the NSG film as the hard mask in this manner, dry etching is performed as the etching in the step of forming the light blockers 40 and e.g. the following condition is used as the etching condition. As the etching gas, a mixed gas of Ar (argon), $CF_4$ (carbon tetrafluoride), and $CHF_3$ (trifluoromethane) is used. The respective gases are used at the following flow rates: 200 [ml/min] for Ar; 20 [ml/min] for $CF_4$; and 15 [ml/min] for $CHF_3$. The pressure of the treatment atmosphere is set to 1.5 [Pa]. The source power is set to about 700 [W] and the bias power applied to the wafer side (side of the semiconductor substrate 11) is set to about 70 [W]. The temperature of the stage on which the etching treatment target is placed is set to about 25[° C.]. The final film thickness of the light blocker 40 is adjusted by time control in the etching.

The same effects can be achieved also by forming the NSG film instead of an oxide film or the like as the hard mask formed on the light blocking layer 41C conformally deposited in this manner.

[Fifth Embodiment]

A fifth embodiment of the present technique will be described. A method for manufacturing the solid-state imaging element 1 according to the present embodiment is different from the above-described fourth embodiment in that the light blocking layer 41 is so formed as to fill the gap part 31 between the in-layer lenses 30 adjacent to each other in the step of forming the light blocking layer 41.

Figure 14A:
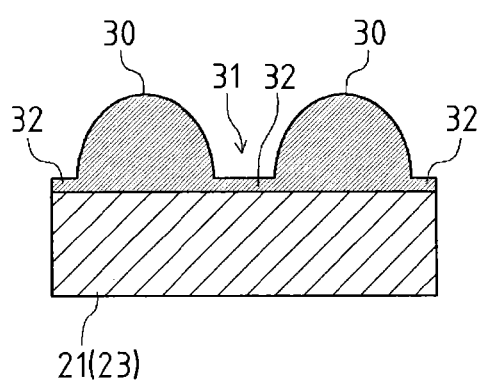
FIGS. 14A to 14E are explanatory diagrams about a method for manufacturing the solid-state imaging element according to a fifth embodiment of the present technique.

In the method for manufacturing the solid-state imaging element 1 according to the present embodiment, as shown in FIG. 14A, first the in-layer lenses 30 are formed on the waveguide 21 by using e.g. SiN. Thereafter, as shown in FIG. 14B, the etching stopper film 51 is formed on the in-layer lenses 30. Next, as shown in FIG. 14C, film deposition is performed on the etching stopper film 51 covering the in-layer lenses 30 by using a light blocking material in such a manner as to fill the gap part 31 between the lenses of the in-layer lenses 30 and thereby the light blocking layer 41 is formed.

Figure 14D:
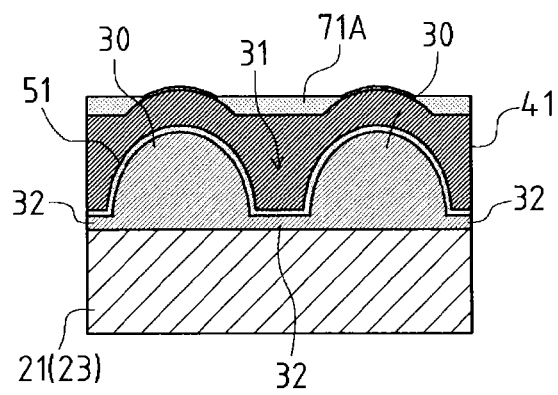
Figure 14B:
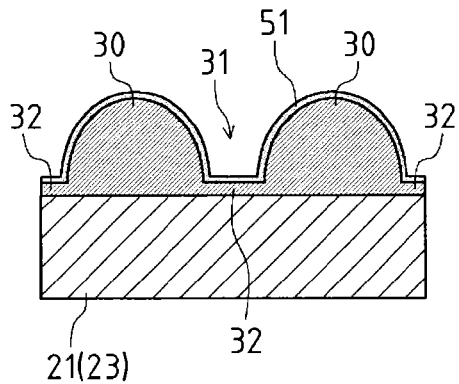

Subsequently, as shown in FIG. 14D, a hard mask 71A is formed on the light blocking layer 41 deposited to fill the gap part 31. The hard mask 71A is selectively formed in such a manner as to fill the gap part 31 at the boundary part between the in-layer lenses 30 adjacent to each other. Specifically, as shown in FIG. 14D, on the light blocking layer 41 in the gap part 31 between the lenses of the in-layer lenses 30, the hard mask 71A is formed to a position lower than the peak of the light blocking layer 41 on the in-layer lens 30. At the part other than the gap part 31, including the peak, on the light blocking layer 41, the hard mask 71A is formed with a comparatively small thickness.

Figure 14E:
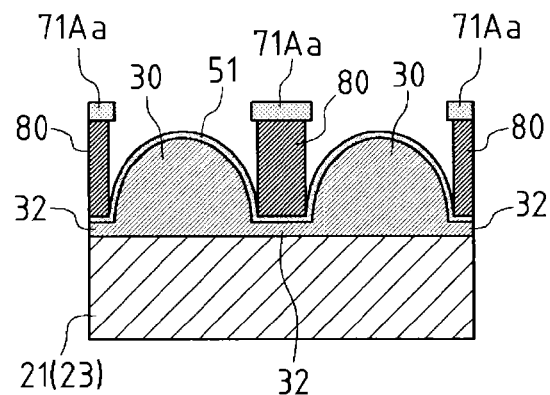
Figure 14C:
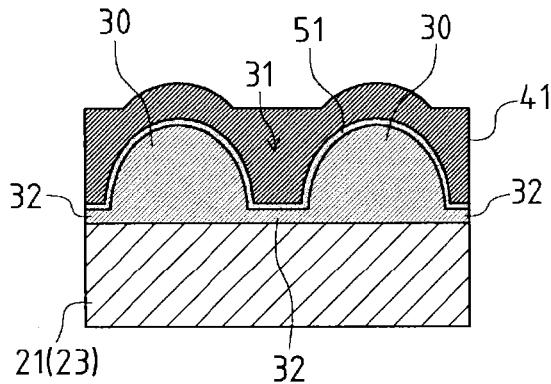

After the hard mask 71A is formed, as shown in FIG. 14E, the light blocking layer 41 and the hard mask 71A are so etched that the light blocking material is left at the boundary part between the in-layer lenses 30 adjacent to each other and thereby light blockers 80 composed of the light blocking material are formed at the boundary parts between the in-layer lenses 30 adjacent to each other.

In this etching step, the light blocking layer 41 and the hard mask 71A are partially removed in such a manner that the light blocking layer 41 with a predetermined film thickness is left over the flat parts 32 between the lenses of the in-layer lenses 30 with the intermediary of the etching stopper film 51 and the light blockers 80 are formed by the material of the light blocking layer 41. At this time, the light blocking layer 41 is etched after the comparatively-thin hard mask 71A formed on the light blocking layer 41 at the peak part of the in-layer lens 30 is removed ahead. Furthermore, the etching is so performed that the light blocking layer 41 is not left on the in-layer lenses 30 and the etching stopper film 51 is not removed.

To perform such selective etching, in the present embodiment, an etching condition that provides high etching selectivity between the material of the above-described etching stopper film 51 and the material of the light blocking layer 41 is employed.

Furthermore, isotropic etching is performed in the etching step so that the light blockers 80 may be formed through processing of the light blocking layer 41 into pillar shapes as shown in FIG. 14E. Specifically, according to the manufacturing method of the present embodiment, the light blocker 80 formed at the boundary part between the in-layer lenses 30 adjacent to each other is formed not only on the bottom of the gap part 31 but also to the upper area of the gap part 31 as a pillar portion. Remaining films 71Aa of the hard mask 71A exist on the light blockers 80. Therefore, the height (film thickness) of the light blocker 80 is equal to the film thickness of the part of the light blocking layer 41 deposited to fill the gap part 31.

As described above, in the present embodiment, the light blocking material is so deposited as to fill the gap part 31 in the step of forming the light blocking layer 41, and the step of forming the hard mask 71A at the boundary part between the in-layer lenses 30 on the light blocking layer 41 is further carried out between the step of forming the light blocking layer 41 and the step of forming the light blockers 80.

According to the method for manufacturing the solid-state imaging element 1 in accordance with the present embodiment, the light blocker 80 can be formed not only on the bottom of the gap part 31 between the lenses but also to the upper area of the gap part 31 without spoiling the lens function of the in-layer lenses 30. Thus, the light blocking function by the light blocker 80 can be enhanced. In particular, high light blocking capability against oblique light whose incident angle is large is obtained. Due to this feature, a structure having a high color crosstalk prevention effect can be achieved in the solid-state imaging element 1. Also in the present embodiment, an NSG film can be employed as the hard mask similarly to the modification example of the fourth embodiment.

[Film Deposition Condition]

The manufacturing methods of the above-described respective embodiments are manufacturing methods based on the assumption that the material of the in-layer lens 30 is an inorganic material, such as SiN (silicon nitride), permitting a high temperature process. Therefore, for example if the material of the in-layer lens 30 is e.g. a resin, the in-layer lens 30 cannot withstand the high temperature process in some cases.

So, in the step of forming the light blocking layer 41 and the step of forming the etching stopper film 51, a temperature condition under which the temperature of the in-layer lens 30 is at most 200° C. can be used as the film deposition condition of the light blocking layer 41 or the etching stopper film 51. That is, a low temperature process at a temperature of at most 200° C. is desirable if a lens incapable of withstanding a high temperature process, such as a resin lens, is used as the in-layer lens 30. Specifically, the process is as follows.

For example, as shown in FIG. 14A, the in-layer lenses 30 are formed on the waveguide 21 by using e.g. SiN. Thereafter, as shown in FIG. 14B, the etching stopper film 51 is formed on the in-layer lenses 30. As the etching stopper film 51, a $SiO_2$ (silicon oxide film) is conformally deposited with a film thickness of several tens to hundreds of nanometers under a temperature condition of at most 200° C. for example.

Next, as shown in FIG. 14C for example, film deposition is performed on the etching stopper film 51 covering the in-layer lenses 30 by using a light blocking material in such a manner as to fill the gap part 31 between the lenses of the in-layer lenses 30 and thereby the light blocking layer 41 is formed. In this step, the light blocking layer 41 is formed under a film deposition condition at a temperature of at most 200° C. As the method for forming the light blocking layer 41 under a film deposition condition at a temperature of at most 200° C., e.g. a sputtering method, evaporation, or physical vapor deposition (PVD) is preferably used. Thereafter, the step of forming the light blockers 40 between the lenses by etching is carried out through e.g. the step of forming the hard mask 71 similarly to the above-described respective embodiments.

As described above, if a lens incapable of withstanding a high temperature process, such as a resin lens, is used as the in-layer lens 30, it is preferable to perform film deposition of the light blocking layer 41 and the etching stopper film 51 under a temperature condition in which the temperature of the in-layer lens 30 is at most 200° C. in the step of forming the light blocking layer 41 and the step of forming the etching stopper film 51. This makes it possible to form the light blockers 40 between the lenses of the in-layer lenses 30 even if the in-layer lens 30 is a lens incapable of withstanding a comparatively high temperature process, such as a resin lens. If the step of forming the etching stopper film 51 is not carried out, a temperature condition of at most 200° C. is used as the film deposition condition of the light blocking layer 41 in the step of forming the light blocking layer 41.

In the second to fifth embodiments explained above, the in-layer lens 30 may be a digital lens (see FIGS. 7A to 7C) or a gapless lens (see FIGS. 8A to 8C) and the light blocking layer 41 may have a multilayer structure including the underlying film 42 as an adhesion layer (see FIGS. 10A and 10B) similarly to the first embodiment, and the same effects can be achieved.

[Configuration Example of Electronic Apparatus]

Figure 15:
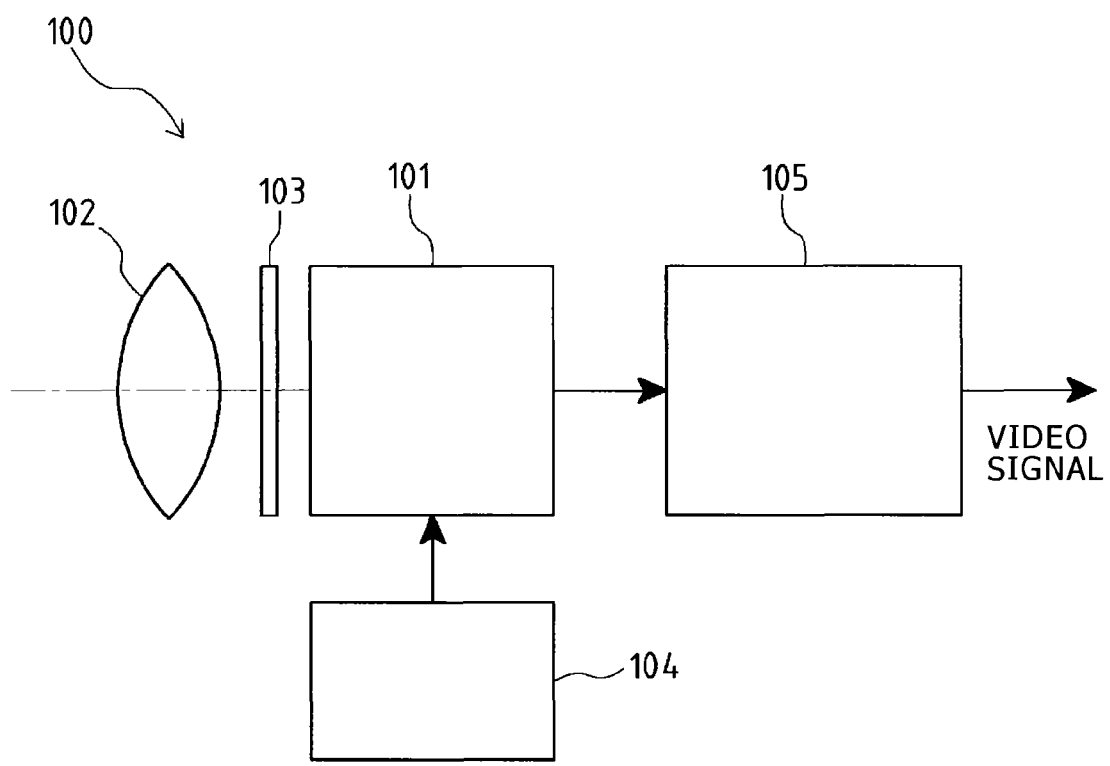
FIG. 15 is a diagram showing the configuration of electronic apparatus according to one embodiment of the present technique.

The solid-state imaging elements according to the above-described embodiments are applied to various kinds of electronic apparatus such as digital still camera referred to as the so-called digital camera, digital video camcorder, cellular phone having an imaging function, and other pieces of apparatus. In the following, a video camcorder 100 as one example of electronic apparatus including the solid-state imaging element according to the above-described embodiment will be described with use of FIG. 15.

The video camcorder 100 performs photographing of still images or moving images. The video camcorder 100 has a solid-state imaging element 101 according to the above-described embodiment, an optical system 102, a shutter device 103, a drive circuit 104, and a signal processing circuit 105.

The optical system 102 is configured as e.g. an optical lens system having one or plural optical lenses and guides incident light to light receiving parts (light receiving parts 3) of the solid-state imaging element 101. The optical system 102 forms an image on the imaging plane of the solid-state imaging element 101 based on image light (incident light) from a subject. Thereby, a signal charge is accumulated in the solid-state imaging element 101 for a certain period. The shutter device 103 is a configuration for controlling the period of light irradiation to the solid-state imaging element 101 and the light blocking period.

The drive circuit 104 drives the solid-state imaging element 101. The drive circuit 104 generates a drive signal (timing signal) for driving the solid-state imaging element 101 at a predetermined timing and supplies it to the solid-state imaging element 101. By the drive signal supplied from the drive circuit 104 to the solid-state imaging element 101, transfer operation of the signal electrode of the solid-state imaging element 101 and so forth are controlled. That is, the solid-state imaging element 101 carries out the transfer operation of the signal charge and so forth based on the drive signal supplied from the drive circuit 104.

The drive circuit 104 has a function to generate various kinds of pulse signals as drive signals for driving the solid-state imaging element 101 and a function as a driver that converts the generated pulse signals to drive pulses for driving the solid-state imaging element 101. The drive circuit 104 also generates and supplies a drive signal for controlling the operation of the shutter device 103.

The signal processing circuit 105 has a function to execute various kinds of signal processing and processes an output signal of the solid-state imaging element 101. The signal processing circuit 105 processes the input signal to thereby output a video signal. The video signal output from the signal processing circuit 105 is stored in a storage medium such as a memory and output to a monitor. The video camcorder 100 has a power supply section such as a battery that supplies power to the drive circuit 104 and so forth, a storage section that stores the video signal generated by imaging and so forth, a control section that controls the whole device, etc.

The video camcorder 100 of the present embodiment encompasses also a form of a camera module or an imaging function module obtained by integrating the solid-state imaging element 101, the optical system 102, the shutter device 103, the drive circuit 104, and the signal processing circuit 105 into a module.

According to the video camcorder 100 that has the above-described configuration and includes the solid-state imaging element 101 of the present embodiment, color crosstalk at the boundary part between the adjacent pixels 7 of colors different from each other can be reduced due to provision of the light blockers 40 at the boundary parts between the in-layer lenses 30 adjacent to each other. Furthermore, because the light blockers 40 are composed of a metal, high light blocking capability can be achieved. In addition, high heat resistance that allows withstanding even against a high temperature process can be achieved, so that the application range can be widened.

Furthermore, by employing the method for manufacturing the solid-state imaging element according to any of the above-described respective embodiments as the step of manufacturing the solid-state imaging element 101 included in the video camcorder 100, the light blockers 40 can be formed in a self-aligned manner in providing the light blockers 40 at the boundary parts between the lenses of the in-layer lenses 30 provided corresponding to the light receiving parts 3 of the respective pixels 7. Thus, the accuracy of pattern alignment between the in-layer lens 30 and the light blocker 40 can be enhanced and it is possible to easily respond to microminiaturization and increase in the number of pixels.

The present technique can have the following configurations.

(1) A method for manufacturing a solid-state imaging element, the method including forming lenses that are each provided corresponding to a light receiving part of a respective one of a plurality of pixels arranged in an imaging area over a semiconductor substrate and collect light onto the light receiving parts, forming a light blocking layer by performing film deposition on the lenses by using a material having light blocking capability, and forming a light blocker composed of the material having light blocking capability at a boundary part between the lenses adjacent to each other by etching the light blocking layer in such a manner that the material having light blocking capability is left at the boundary part between the lenses.

(2) The method for manufacturing a solid-state imaging element according to (1), wherein the material having light blocking capability is a metal.

(3) The method for manufacturing a solid-state imaging element according to (1) or (2), wherein the forming the light blocking layer includes forming an adhesion layer for allowing adhesion of the material having light blocking capability to a material to form the lenses.

(4) The method for manufacturing a solid-state imaging element according to one of (1) to (3), further including forming an etching stopper film on the lenses by using a material having etching selectivity with respect to the material having light blocking capability, between the forming the lenses and the forming the light blocking layer.

(5) The method for manufacturing a solid-state imaging element according to (4), wherein a material having a refractive index that is lower than a refractive index of a material to form the lenses and is higher than a refractive index of a material of a layer formed over the lenses with intermediary of the etching stopper film is used as the material having etching selectivity.

(6) The method for manufacturing a solid-state imaging element according to (4) or (5), wherein film deposition of the light blocking layer and the etching stopper film is performed under a temperature condition in which temperature of the lenses is at most 200° C., in the forming the light blocking layer and the forming the etching stopper film.

(7) The method for manufacturing a solid-state imaging element according to one of (1) to (6), further including applying a planarization resist film over the light blocking layer, between the forming the light blocking layer and the forming the light blocker, wherein the material having light blocking capability is conformally deposited in the forming the light blocking layer, and the planarization resist film is etched together with the light blocking layer in the forming the light blocker.

(8) The method for manufacturing a solid-state imaging element according to one of (1) to (6), further including forming a hard mask at the boundary part between the lenses on the light blocking layer, between the forming the light blocking layer and the forming the light blocker.

(9) The method for manufacturing a solid-state imaging element according to (8), wherein the material having light blocking capability is conformally deposited in the forming the light blocking layer.

(10) The method for manufacturing a solid-state imaging element according to one of (1) to (9), wherein the lenses are gapless lenses having no gap between the lenses adjacent to each other.

The present disclosure contains subject matter related to that disclosed in Japanese Priority Patent Application JP 2011-142428 filed in the Japan Patent Office on Jun. 28, 2011, the entire content of which is hereby incorporated by reference.

It should be understood by those skilled in the art that various modifications, combinations, sub-combinations and alterations may occur depending on design requirements and other factors in so far as they are within the scope of the appended claims or the equivalents thereof.

What is claimed is:

1. A method for manufacturing a solid-state imaging element, the method comprising:
   forming first lenses that are each provided corresponding to a light receiving part of a respective one of a plurality of pixels arranged in an imaging area over a semiconductor substrate and collect light onto the light receiving parts;
   forming a light blocking layer by performing film deposition on the first lenses by using a material having light blocking capability;
   forming a first light blocker composed of the material having light blocking capability at a boundary part between the first lenses adjacent to each other by etching the light blocking layer in such a manner that the material having light blocking capability is left at the boundary part between the first lenses;
   forming second lenses that are provided over each first lens and that are convex, the second lenses being adjacent to each other with no gap therebetween; and
   forming a second light blocker formed on a concave boundary between each of the second lenses.

2. The method for manufacturing a solid-state imaging element according to claim 1, wherein
   the material having light blocking capability is a metal.

3. The method for manufacturing a solid-state imaging element according to claim 1, wherein
   the forming the light blocking layer includes forming an adhesion layer to allow adhesion of the material having light blocking capability to a material to form the first lenses.

4. The method for manufacturing a solid-state imaging element according to claim 1, further comprising
   forming an etching stopper film on the first lenses by using a material having etching selectivity with respect to the material having light blocking capability, between the forming the first lenses and the forming the light blocking layer.

5. The method for manufacturing a solid-state imaging element according to claim 4, wherein
   a material having a refractive index that is lower than a refractive index of a material to form the first lenses and is higher than a refractive index of a material of a layer formed over the lenses with intermediary of the etching stopper film is used as the material having etching selectivity.

6. The method for manufacturing a solid-state imaging element according to claim 4, wherein
   film deposition of the light blocking layer and the etching stopper film is performed under a temperature condition in which temperature of the first lenses is at most 200° C., in the forming the light blocking layer and the forming the etching stopper film.

7. The method for manufacturing a solid-state imaging element according to claim 1, further comprising
   applying a planarization resist film over the light blocking layer, between the forming the light blocking layer and the forming the light blocker, wherein
   the material having light blocking capability is conformally deposited in the forming the light blocking layer, and
   the planarization resist film is etched together with the light blocking layer in the forming the light blocker.

8. The method for manufacturing a solid-state imaging element according to claim 1, further comprising
   forming a hard mask at the boundary part between the lenses on the light blocking layer, between the forming the light blocking layer and the forming the light blocker.

9. The method for manufacturing a solid-state imaging element according to claim 8, wherein
the material having light blocking capability is conformally deposited in the forming the light blocking layer.

10. The method for manufacturing a solid-state imaging element according to claim 1, wherein
the first lenses are gapless lenses having no gap between the first lenses adjacent to each other.

11. A method for manufacturing electronic apparatus having
a solid-state imaging element,
an optical system that guides incident light to light receiving parts of the solid-state imaging element,
a drive circuit that generates a drive signal for driving the solid-state imaging element, and
a signal processing circuit that processes an output signal of the solid-state imaging element,
the method comprising, as manufacturing the solid-state imaging element,
forming first lenses that are each provided corresponding to the light receiving part of a respective one of a plurality of pixels arranged in an imaging area over a semiconductor substrate and collect light onto the light receiving parts;
forming a light blocking layer by performing film deposition on the first lenses by using a material having light blocking capability;
forming a first light blocker composed of the material having light blocking capability at a boundary part between the first lenses adjacent to each other by etching the light blocking layer in such a manner that the material having light blocking capability is left at the boundary part between the first lenses;
forming second lenses that are provided over each first lens and are convex, the second lenses being formed adjacent to each other with no gap therebetween; and
forming a second light blocker on a concave boundary between second lenses.

* * * * *